United States Patent [19]
Widmer

[11] Patent Number: 5,648,776
[45] Date of Patent: Jul. 15, 1997

[54] SERIAL-TO-PARALLEL CONVERTER USING ALTERNATING LATCHES AND INTERLEAVING TECHNIQUES

[75] Inventor: Albert X. Widmer, Katonah, N.Y.

[73] Assignee: International Business Machines Corporation, Armonk, N.Y.

[21] Appl. No.: 56,148

[22] Filed: Apr. 30, 1993

[51] Int. Cl.$^6$ .................................................. H03M 9/00
[52] U.S. Cl. ........................ 341/100; 375/368; 370/498
[58] Field of Search ..................................... 341/100, 101; 375/116, 368; 370/105.1, 105.4, 100.1, 112

[56] References Cited

U.S. PATENT DOCUMENTS

| | | | |
|---|---|---|---|
| 3,914,553 | 10/1975 | Melindo et al. | 341/100 |
| 4,377,806 | 3/1983 | Elliott et al. | 341/101 |
| 4,486,739 | 12/1984 | Franaszek et al. | 341/58 |
| 4,775,990 | 10/1988 | Kamura et al. | |
| 4,827,477 | 5/1989 | Avaneas | |
| 5,032,010 | 7/1991 | Su | |
| 5,101,203 | 3/1992 | Gersbach et al. | |
| 5,148,453 | 9/1992 | Newby et al. | 375/116 |
| 5,253,254 | 10/1993 | Roberts et al. | 370/100.1 |
| 5,287,359 | 2/1994 | Engelse | 370/100.1 |

OTHER PUBLICATIONS

R.B. Nubling, et al. "High–Speed 8:1 Multiplexer and 1:8 Demultiplexer Implemented . . . " IEEE Journal of Solid-State Circuits, Vo. 26, No. 10, Oct. 1991, pp. 1354–1361.

D.T. Kong, "2.488 GB/S Sonet Multiplexer/Demultiplexer With Frame Detection Capability" IEEE Journal On Selected Areas in Communications, vol. 9, No. 5, Jun. 1991, pp. 726–731.

F.R. Gfeller, "GBIT/S Serialiser/Deserialiser Subsystem for GAAS Large–Scale . . . " IEEE Proceedings, vol. 136, Pt. G, No. 4., Aug., 1989, pp. 221–227.

H–M. Rein, "Multi–Gigabit–Per–Second Silicon Bipolar IC's for Future Optical-Fiber . . . " IEEE Journal of Solid–State Circuits, vol. 23, No. 3, Jun., 1988, pp. 664–675.

R.M. Chambers "Deserializer for Serial Data Links", Research Disclosure, Jul., 1985, No. 255, No. 25535.

F.D. Ferraiolo, et al. "Error Detection/Fault Isolation for a Fiber–Optic Communication . . . " IBM Tech. Discl. Bull. vol. 33, No. 12, May, 1991, pp. 38–39.

W.E. Tutt, "Parity Generated and Check Circuit", IBM Tech. Discl. Bull., vol. 25, No. 5 Oct., 1982, pp. 2695–2697.

A.X. Widmer, "Self–Starting Timing Ring Circuit", IBM Tech. Discl. Bull. vol. 35, No. 5 Oct., 1992, pp. 446–448.

R.L. Deremer, et al. "High–Speed Word Recognizer for a Serial Shift Register" IBM Tech. Discl. Bull. vol. 33, No. 5, Oct., 1990, pp. 407–410.

*Primary Examiner*—Howard L. Williams
*Attorney, Agent, or Firm*—Daniel P. Morris

[57] ABSTRACT

A serial bit stream is first connected to two parallel bit streams using two half rate clocks. The 2-way parallel bit stream is then converted into a five-way parallel bit stream. Therefore, the clock rate of the five-way parallel bit stream is 1/5 of the clock rate of the input bit stream. The input bit stream contains a unique bit sequence or comma to identify the byte and word boundaries. The comma is detected in five way bit stream. Since the clock rate at the five-way bit stream is five times slower than at the input bit stream, substantially slower circuits which operate at lower power can be used to detect the byte boundaries. Therefore, substantially less expensive circuits can be used to adjust the byte boundaries. Quarter rate clocks in combination with two port latches can provide the same bit rate as half-rate clocks, but reduce the lifetime of CMOS circuits substantially less.

13 Claims, 24 Drawing Sheets

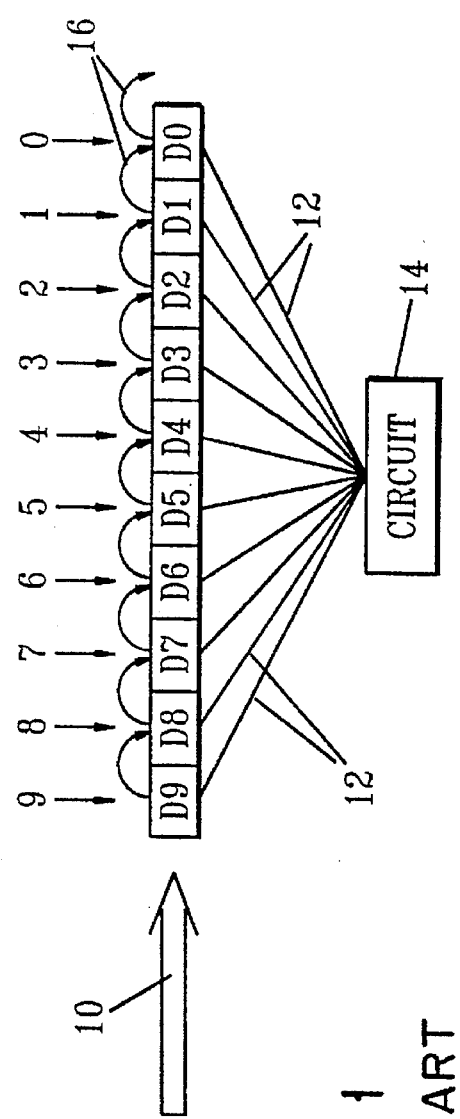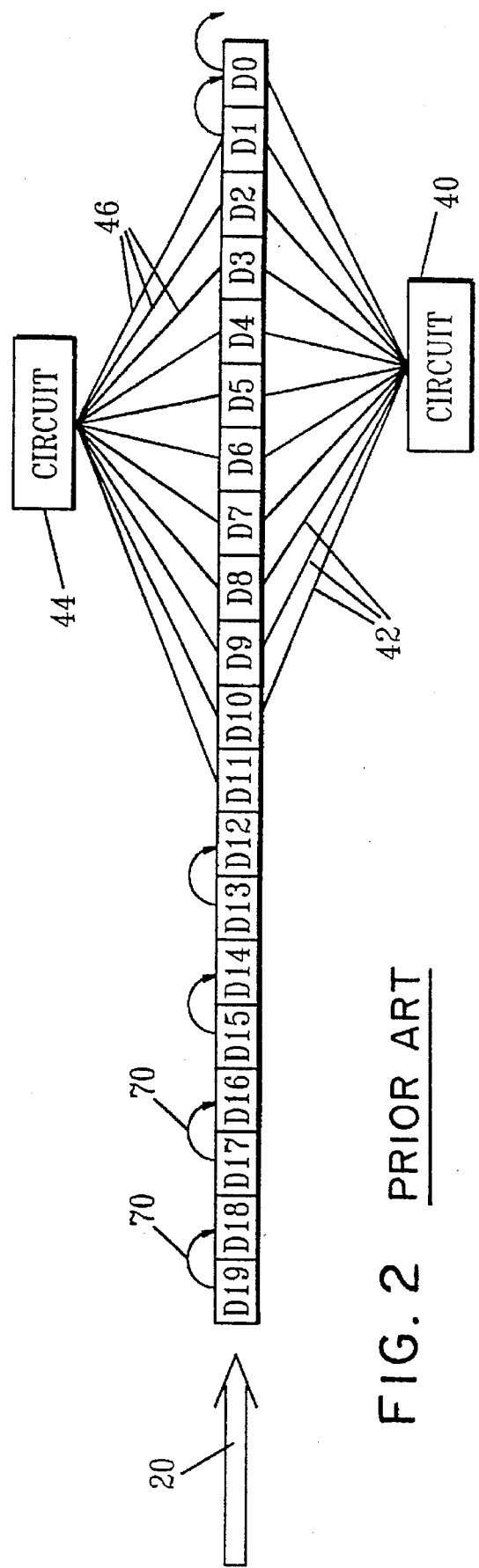
FIG. 1 PRIOR ART
FIG. 2 PRIOR ART

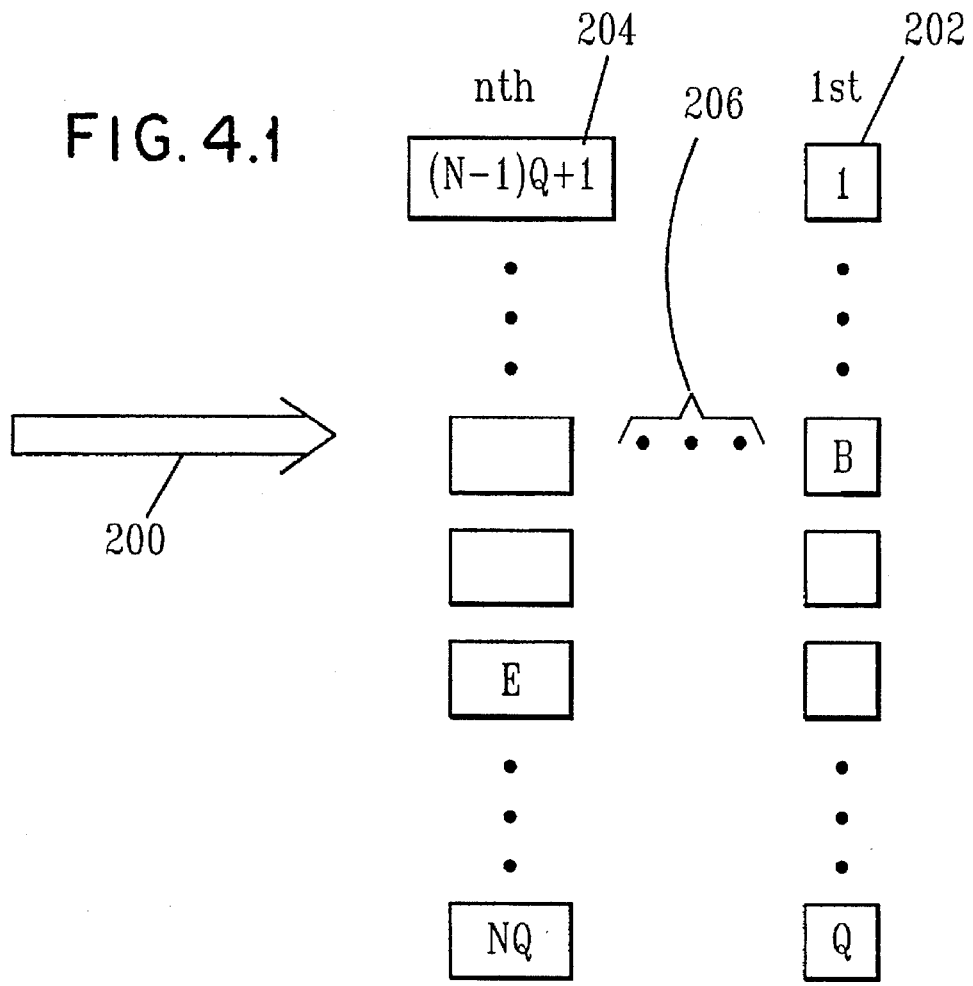
FIG. 4.1
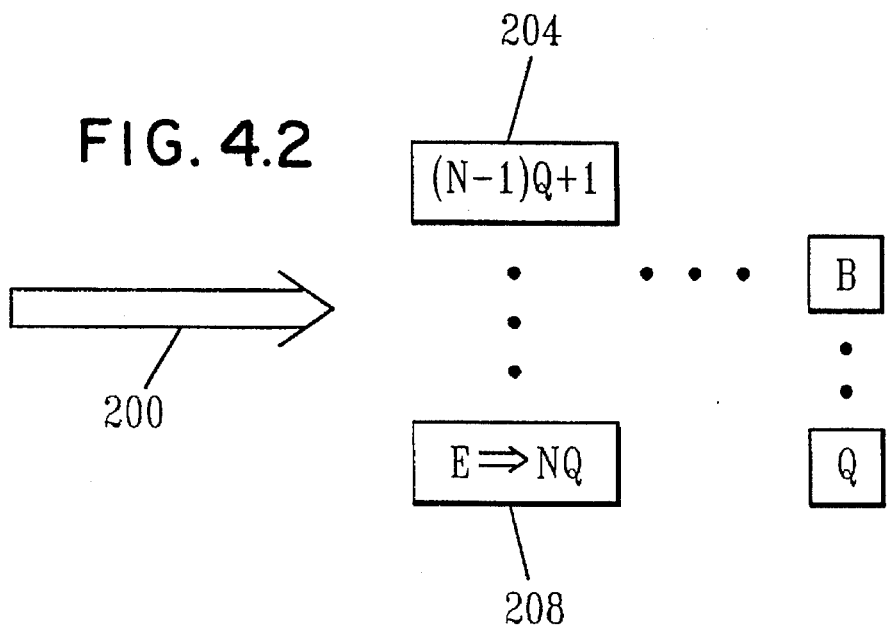
FIG. 4.2

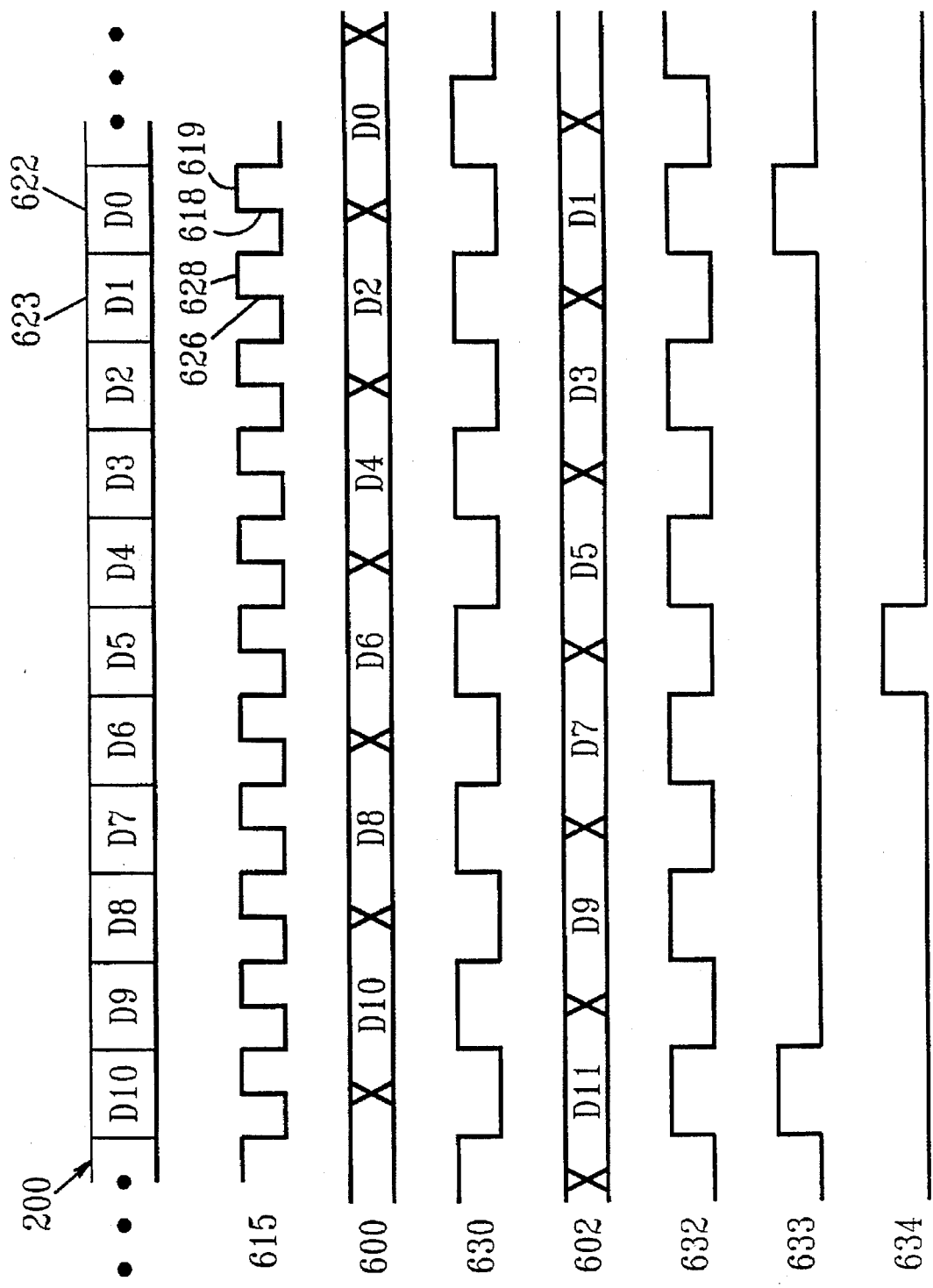

FIG. 6.2
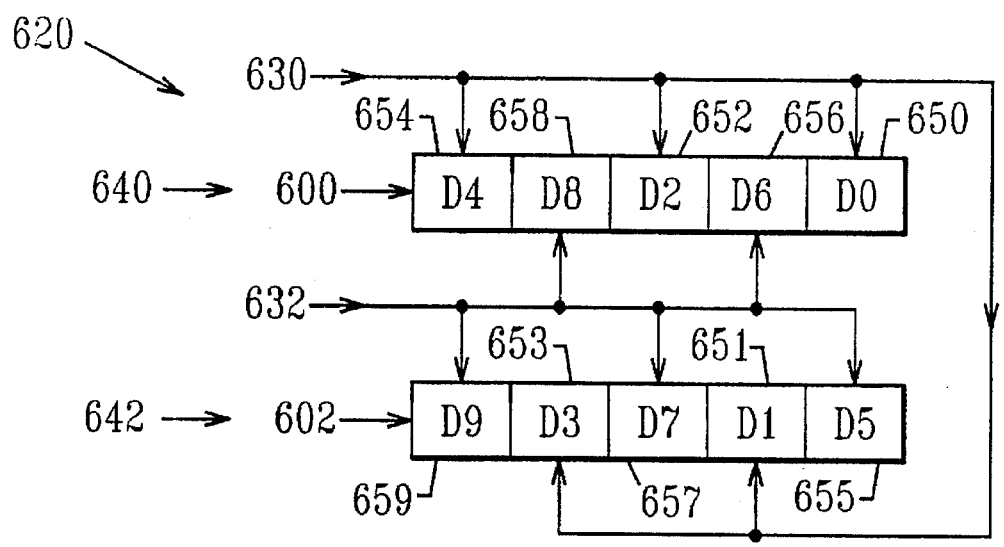
FIG. 6.3
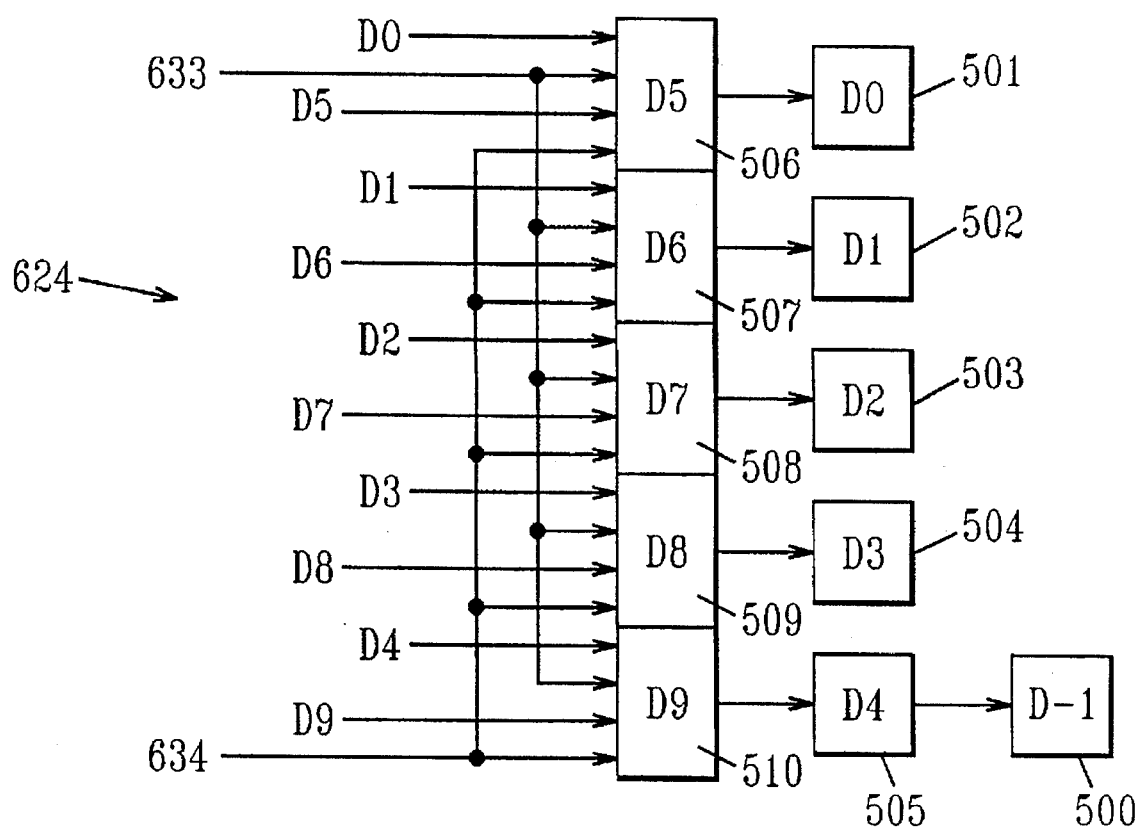

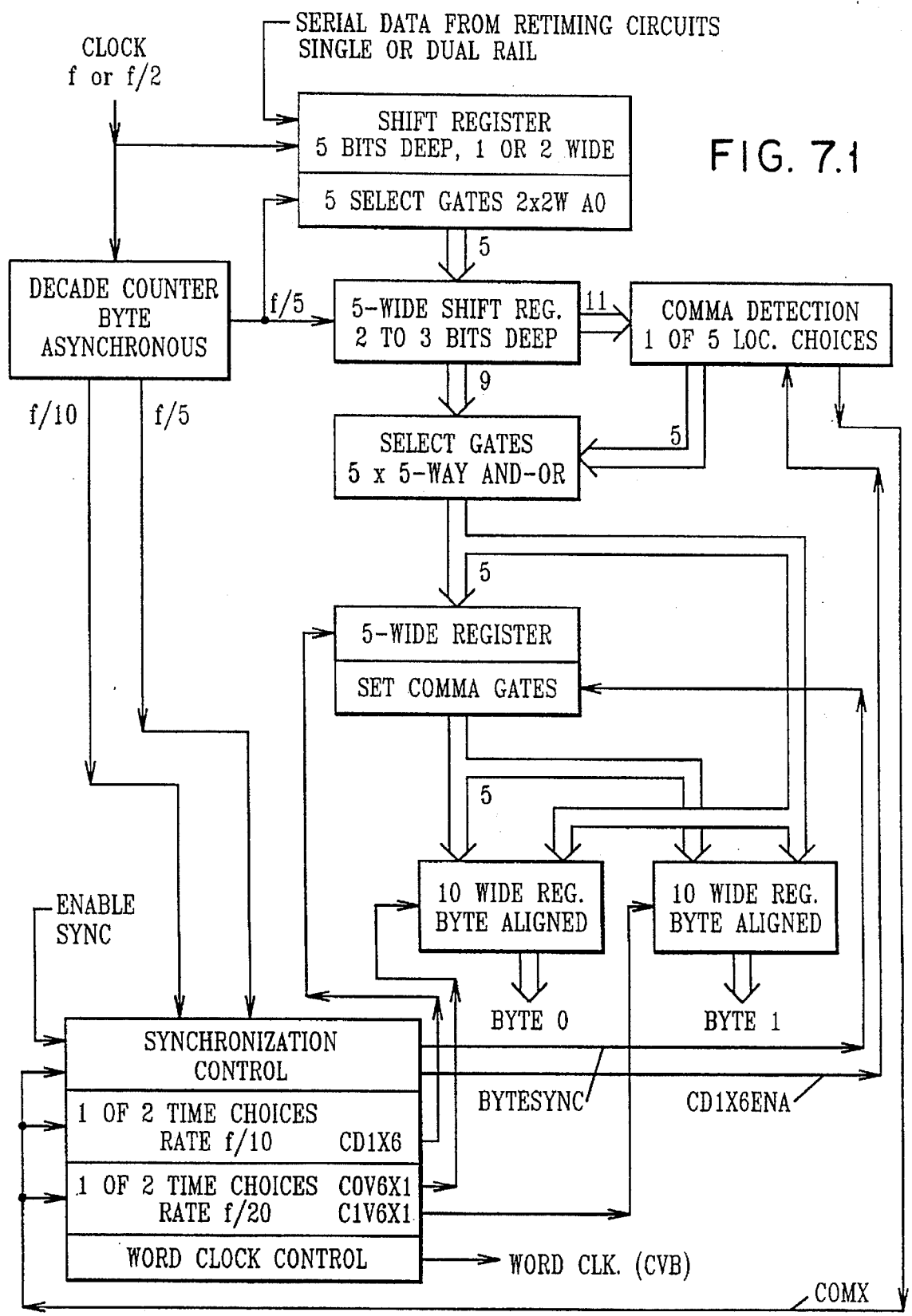
FIG. 7.1

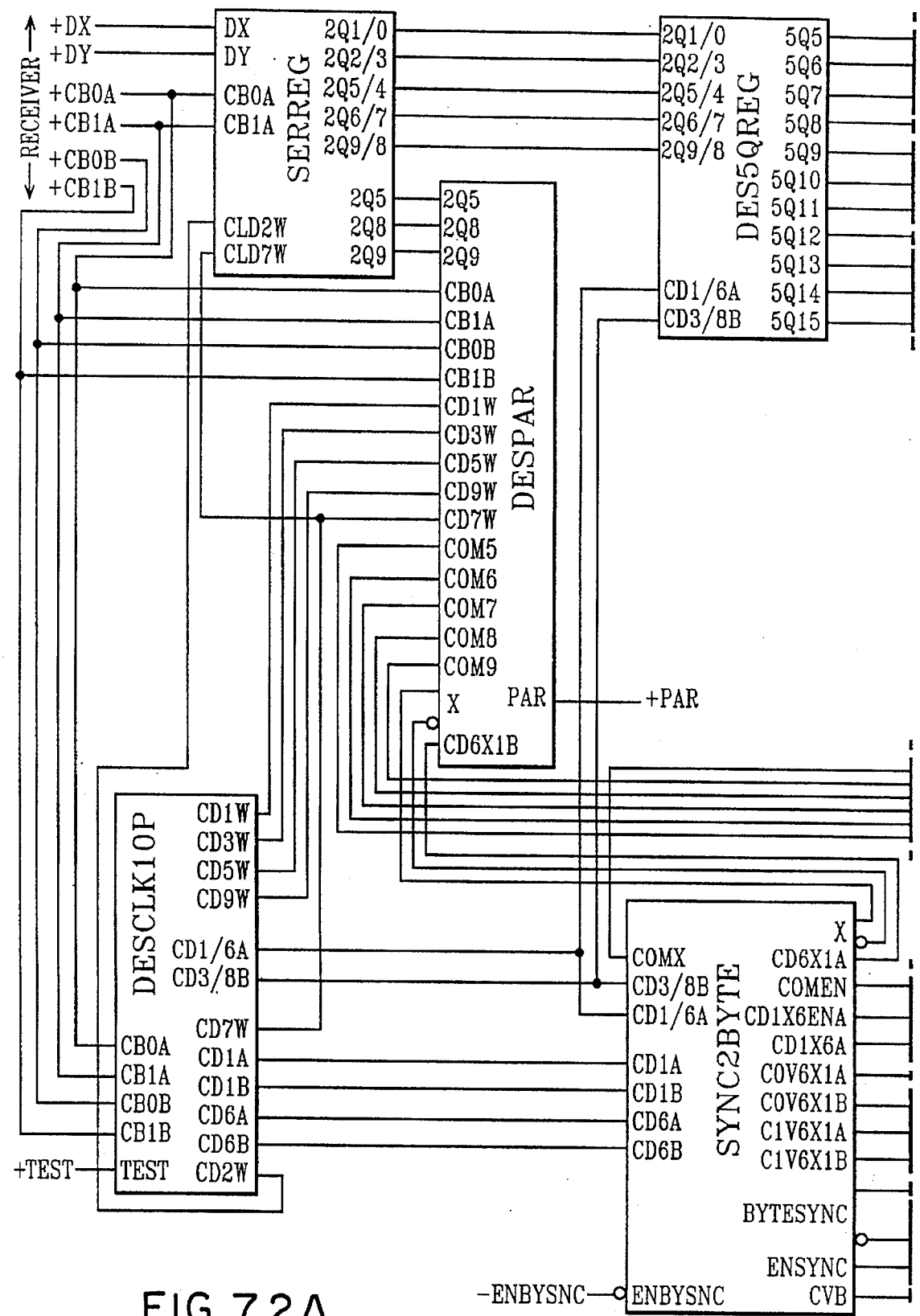
FIG. 7.2A

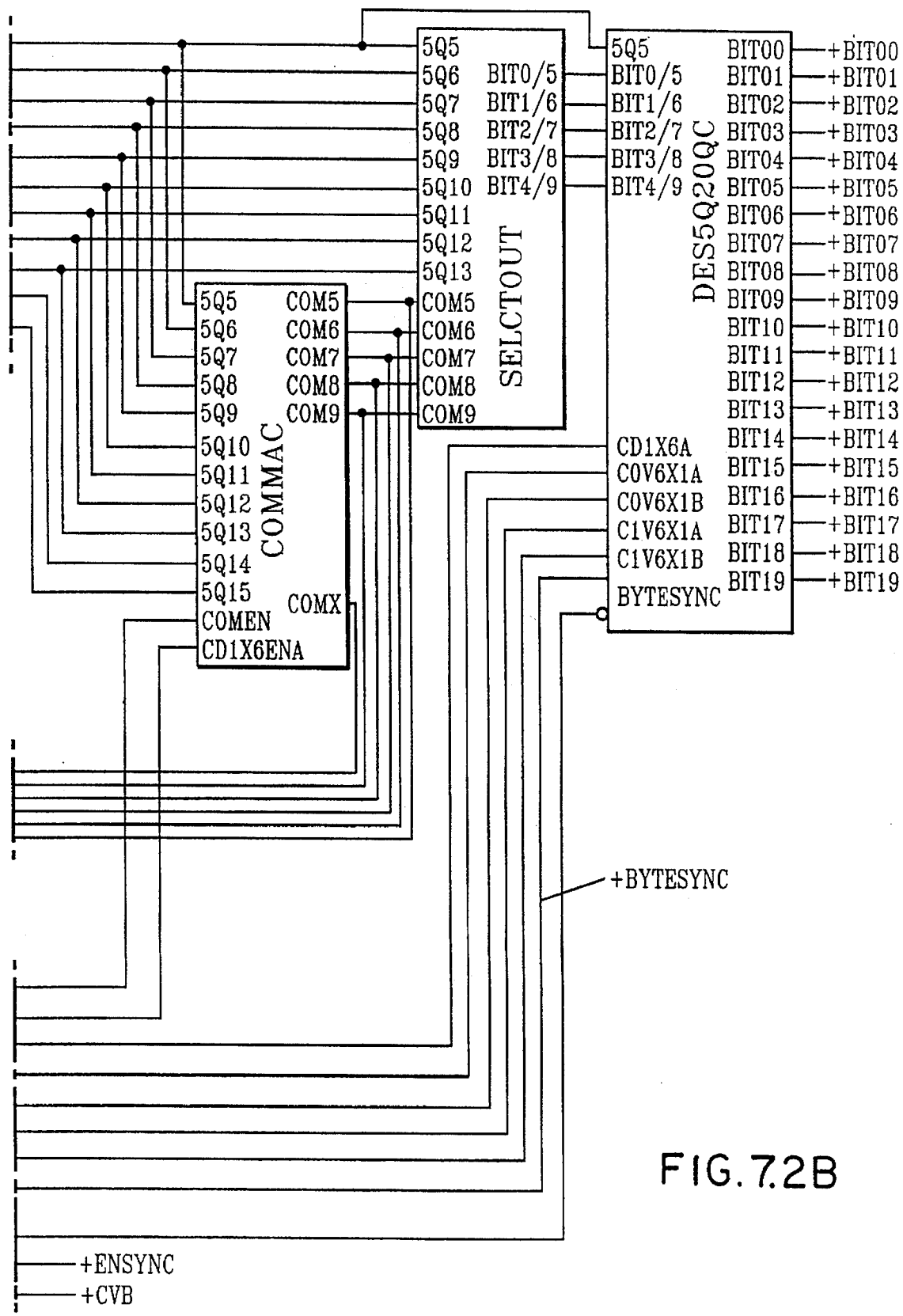
FIG. 7.2B

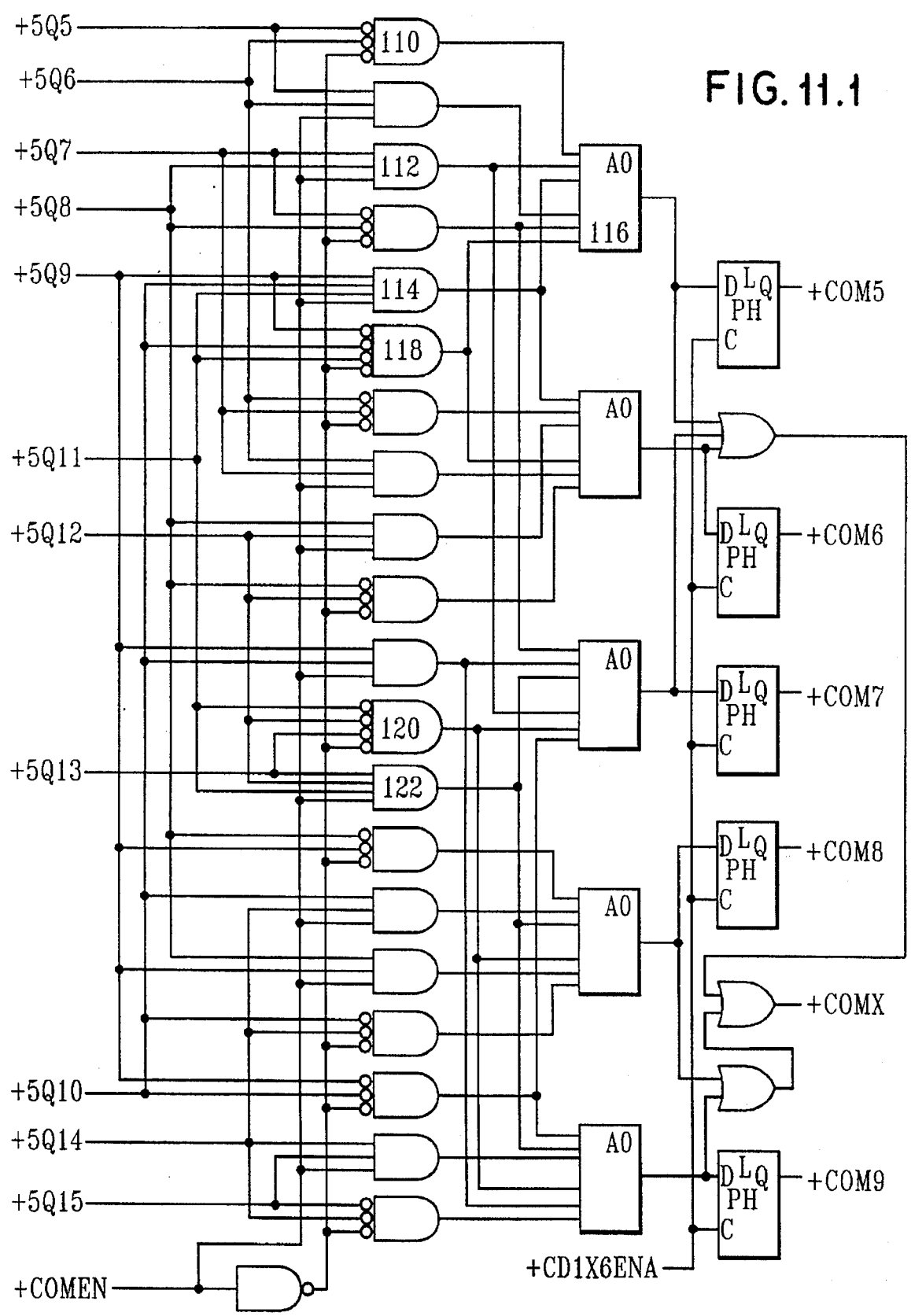
FIG. 11.1

FIG. 11.2
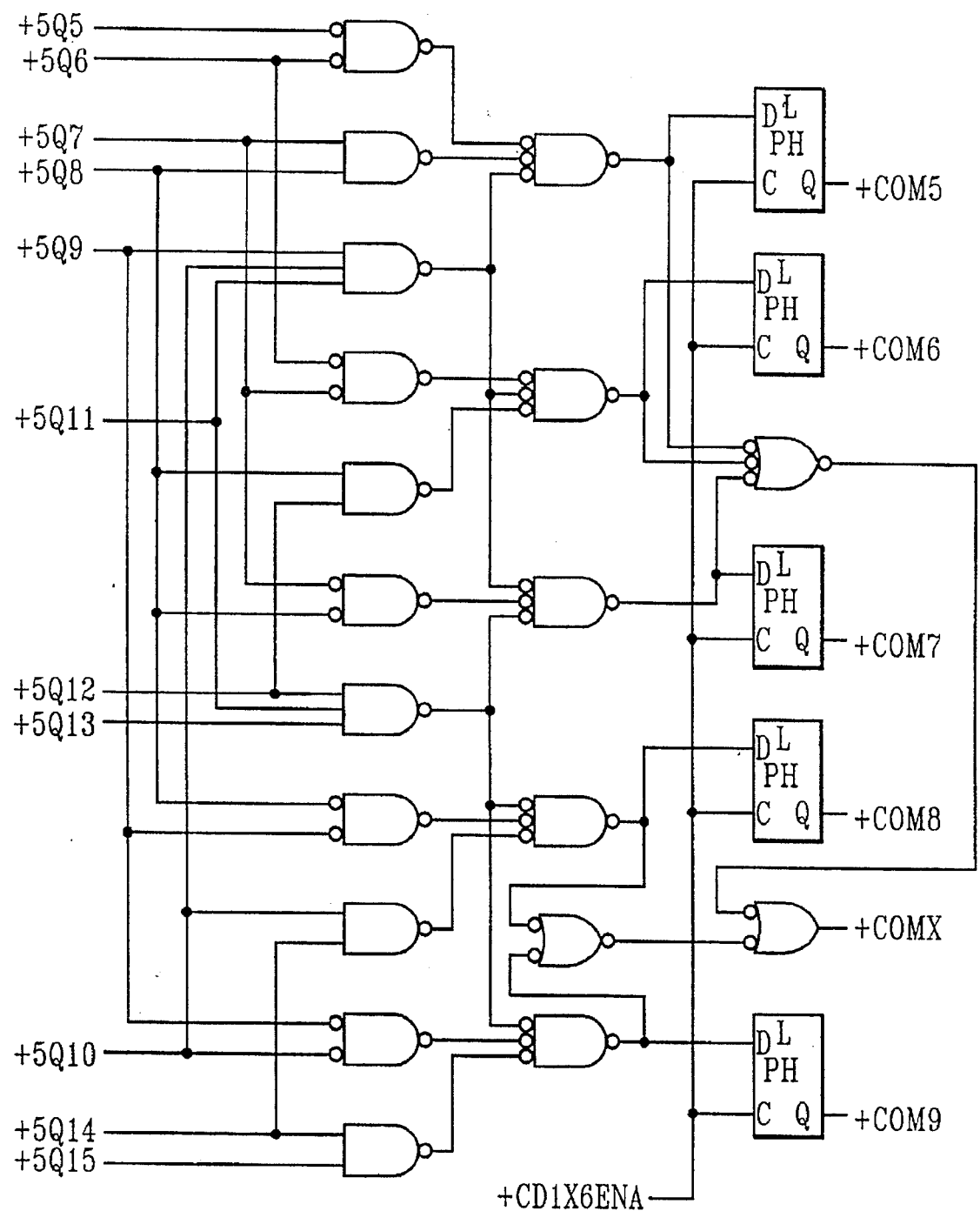

SERIAL-TO-PARALLEL CONVERTER USING ALTERNATING LATCHES AND INTERLEAVING TECHNIQUES

FIELD OF THE INVENTION

This invention relates, in general, to communication systems and information and data processing systems, and more particularly, to digital data regeneration and deserialization techniques for such systems.

BACKGROUND OF THE INVENTION

In optical fiber transmission systems the trend is to increase the data rate further to exploit the high transmission capacity of single-mode optic fibers. The limiting factor for data rate increases is usually not the data carrying capacity of the optical fiber, but rather electronic circuit performance. In digital communication networks, such as fiber optic transmission systems, the bit sampling clock signal is usually recovered from the incoming serial bit stream. A clock recovery anal bit sampling circuit well suited to interface with this invention is described in U.S. patent application Ser. No. 853,215, filed on Mar. 16, 1992 now issued on Apr. 25, 1994 as U.S. Pat. No. 5,301,196, the teaching of which is incorporated herein by reference. At the communication link receiving end, the transmitted serial bit stream must be regenerated and deserialized. In many such communication systems, a phase locked loop (PLL) is used for recovery of the clock signal that corresponds in frequency and phase to the rate of the bit stream transmitted through the network and received at the station. Data deserialization is typically accomplished by a special circuit called the deserializer. The PLL and deserializer are considered to be critical components in the data communication network. These circuits traditionally operate at the serial bit stream rate and usually limit communication channel data carrying capability.

The present invention, therefore, is designed to solve this performance limitation of conventional digital data regeneration and deserialization techniques, and thus allows higher bit rate signal processing for a given system.

In the near future there will be a need for densely packaged arrays of high speed serial link electronics. It will be desirable to merge these functions with the slower link adaptor functions on a single chip. To reach that goal there is a need for a deserializer with the following attributes:

1. Maximum operating rate for a given technology and maximum given rate and technology.
2. No or minimal reliance on delay tracking.
3. Minimum power dissipation.
4. Flawless operational characteristics (no 'glitches' of any kind).
5. Compatibility with LSSD testing strategies.
6. Support of on-line intermittent fault isolation techniques.

The use of parity for diagnostic purposes has been implemented before:

W. F.. Tutt, "Parity Generate and Check Circuit", Technical Disclosure Bulletin, 25, No. 5, 2695–2697, IBM, October (1982).

F. D. Ferraiolo and L. H. Wilson, "Error Detection/Fault Isolation for a Fiber-Optic Communication lank Using Parity", Technical Disclosure Bulletin, 33, No. 12, 38–39, IBM. May (1991).

However, the circuits proposed previously would seriously limit the maximum operating rate and could not be modified readily for use in a deserializer structure as described herein.

Known deserializers which generally do not meet one or more of the above requirements are described in:

R. M. Chambers, "Deserializer For Serial Data Links", RESEARCH DISCLOSURE, No. 255, 25535, Kenneth Mason Publications Ltd., England, July (1985). PO883-0453 WSR P200 40-500.

Hans-Martin Rein, "Multi-Gigabit-Per-Second Bipolar IC's for Future Optical-Fiber Transmission Systems", Journal of Solid State Circuits, 23, No. 3, 664–675. IEEE, June (1988).

F. R. Gfeller, "Gbit/s serialiser/deserialiser subsystem For GaAs large-scale optoelectronic integration", Proceedings, 136, Pt.G., No. 4, 721–227, IEEE, August (1989).

R. L. Deremer, L. W. Freitag, D. W. Siljenberg, and J. T. Trnka, "High Speed Word Recognizer for a Serial Shift Register", Technical Disclosure Bulletin, 33, No. 5, 407–410, IBM, October (1990).

Dennis T. Kong, "2.488 Gb/s SONET Multiplexer/ Demultiplexer with Frame Detection Capability", Journal on Selected Areas in Communications, 9, No. 5, 726–731, IEEE, June (1991).

R. B. Nubling, James Yu, Keh-Chung Wang, Peter M. Asbeck, Neng-Haung Sheng, Mau-Chung F. Chang, R. I. Pierson, G. J. Sullivan, Mark A. McDonald, A. J. Price, and A.D.M. Chen, "High-Speed 8:1 Multiplexer and 1:8 Demultiplexer Implemented with AlGaAs/ GaAs HBT's", Journal of Selected Areas in Communications, 26, No. 10, 1354–1361, IEEE, October (1991).

Before transmission on a line, data is encoded to simplify the transmitter and receiver circuits and to improve the reliability of the data transfer. For this purpose an 8 bit byte is often translated into a constrained sequence of 10 bits.

When data is transmitted from the sending location to the receiving location, the receiving location must synchronize the clocks of the receiving system to the transmitted data so that it can be properly read. The first level of synchronization is at the bit level, usually implemented by a PLL. This level of synchronization is a prerequisite for the present invention and not a subject of it. The next level of required synchronization is at the byte level. The receiver must find the boundaries of successive coded bytes in the serial bit stream and present one or more bytes in a parallel format aligned with the byte boundaries at the output. The current invention addresses systems with constrained coded bit streams that contain a unique bit sequence for the unambiguous identification of the byte boundaries. The unique bit sequence is usually referred to as the comma. The data may be further structured as 4-byte words and as frames containing a variable number of words. The start and end of a frame are commonly marked by a special word with a comma in the first byte position. An important function of the deserializer is to find the comma in the bit stream and to align the parallel output of the deserializer so that the first bit of a byte and the first byte of a worst appear always on the same output lines.

FIG. 1 schematically shows a conventional deserializer for 10-bit bytes such as described in the articles of Deremer et al., and Gfeller, cited above. To identify the byte boundary in a serial bit stream 10, serial data stream 10 is fed into memory locations 0, 1, 2, 3, 4, 5, 6, 7, 8 and 9 which can be part of a conventional shift register. These ten memory locations contain 10 bits D0, D1, D2, D3, D4, D5, D6, D7, D8 and D9. Circuitry represented by lines 12 connect the memory cells 0–9 to circuit 14 which monitors the ten memory locations 0–9 to determine when the comma character appears. At that time D0 is in cell 0, D1 in cell 1, . . . , and D9 in cell 9 for just one bit period. The bits D0–D9 are shifted through the memory locations 0–9 as represented by arrows 16 in a manner similar to that of a shift register. The bits in the input stream 10 pass through the bit cells 0–9 at the rate of the input stream 10, therefore, the circuitry 12 and 14 must be as fast as the bit rate to be able to read the bits stored in memory locations 0–9. As the transmission rate of communication lines increases, the cost of manufacturing circuitry to read the bits to locate the comma at the bit rate goes up significantly since high speed circuits are generally very costly. In the byte boundary locating system of FIG. 1, when the comma is found, the system clock is set to correspond to the byte boundary, to indicate the time when 10 bits belonging to a single byte are present in the memory locations 0–9 for parallel readout. The byte clock is then said to be synchronized with the input byte stream. This technique is characterized by a constant read-out location of data from the serial register and by variable timing, i.e. the clock is adjusted to catch the data at the right time.

FIG. 2 shows another commonly used technique (which is described in the article of Gfeller cited above) For locating the byte boundary of input stream 20. It is characterized by a constant byte clock, but variable read-out location. i.e. the the read-out location is varied to fit the timing of the clock. In FIG. 2, 20 memory locations, such as 0, 1, 2, ..., 18, and 19 hold two sets of bits D0–D9. In this configuration a first circuit 40 is connected by lines 45 to the first 10 bit locations corresponding to cells 0–9. Another circuit 44 is connected by lines 46 to a second set of 10 bit locations 1–10. A third, fourth. etc. circuit can be connected to a third or fourth set of ten memory locations, each set incremented by one cell location number. The input sequential bit stream 20 is fed into the memory locations 0–19, and the circuits 40 and 44, and lines 42 and 46 simultaneously monitor the first set of ten bit locations and the second set of bit locations, respectively. When the comma is detected by circuit 40 or 42, or when any subsequent similar circuits corresponding to other sets of ten bit locations identify the comma, the system fixes which one of the circuits such as 40 or 44 is to read out the set of 10 bits. The system clock is not changed. The circuits 44 in combination with lines 46, and circuit 40 in combination with lines 42 must operate at the bit rate of input stream 20, since the bits are passed through memory locations 0–19, as represented by arrows 70, at the same rate as the input stream 20. Therefore, the circuits and lines 40, 42, 44 and 46 must have a speed equal to that of the input data rate in order to properly identify the comma. Here again, as the transmission speed of the bits increases, the circuits necessary to identify the comma using the scheme of FIG. 2 substantially increase the cost. There is also a very large number of circuits required for this solution. The circuits require a heavy drive from the register and the clock drivers, which limits its operating speed.

SUMMARY OF THE INVENTION

It is an object of the present invention to provide an improved means for converting serial data to parallel data.

It is an object of the present invention to provide an improved means for identifying the location of a byte or word boundary in a bit stream.

It is another object of the present invention to provide an improved means for converting serial data to parallel data and for identifying a byte and word boundary using circuits having a switching speed slower than the serial bit rate.

It is a further object of the present invention to provide an improved means for converting serial data to parallel data and for identifying a byte and word boundary using substantially less expensive circuitry.

It is yet another object of the present invention to convert serial data to parallel data by first partially deserializing the data so that markers identifying the beginning and ending of words can be identified by slower circuitry than would be necessary to identify these markers in the serial bit stream.

It is an additional object of the present invention to deserialize the data using a plurality of clocks, preferably two clocks, which are out of phase with respect to each other.

It is yet another object of the present invention to use a plurality of clocks which operate at a fraction of the rate of the serial bit stream so that less expensive circuitry can be used to deserialize the data.

A broad aspect of the present invention is a system for deserializing a serial bit stream to a parallel bit stream and for identifying a byte and word boundary in the parallel bit stream.

In a more particular aspect of the present invention the system contains a means for deserializing the serial bit stream into a parallel bit stream and a means for searching for the byte or word boundary in the parallel bit stream.

In another more particular aspect of the present invention the means for locating the byte boundary is a pattern of bits of a predetermined number C. The system has M storage locations for a predetermined number M of bits of parallel data. The M bits of parallel data correspond to M consecutive bits of the sequential data. The M storage locations have a first through an end consecutive storage location. The means for searching for the predetermined number C of bits simultaneous monitors N groups of C consecutive bits of the parallel data. The N groups have a first group through an end group. Each of the N groups has a first bit. The first bit of the first group through the end group corresponds to the bits in the first C storage locations, respectively.

In another more particular aspect of the present invention the parallel data stream is Q bits wide, where a Q is less than M.

In another more particular aspect of the present invention N=Q.

In another more particular aspect of the present invention the M storage locations are stored in a plurality of sets of Q bits.

In another more particular aspect of the present invention M=C+Q−1.

In another more particular aspect of the present invention the serial bit stream is first deserialized into a two bit wide parallel stream using two half-rate clocks, wherein the half-rate clocks operate at one half the frequency of the serial bit stream rate.

Another broad aspect of the present invention is a means for converting serial data to parallel data wherein the conversion is clone using circuits having slower switching speed than the serial bit rate.

Another aspect of the current invention is that the byte boundary realignment is accomplished without ever reducing the interval between the transitions in the byte or word clock outputs.

Another aspect of the invention is that includes circuits to bypass certain internal data transfer steps while the byte boundary is being realigned, to reduce latency, circuit count and power.

Another aspect of the invention is the inclusion of a parity generator near the serial input which does not reduce the bit rate achievable with a given technology. The parity bit is part of a scheme to monitor for intermittent errors generated by failing deserializer circuits.

Another aspect of the invention is a modification using latches with 2 clock inputs which allows the operation with quarter rate clocks. The slower rate clocks result in a significantly longer lifetime and better reliability of CMOS embodiments of the invention.

BRIEF DESCRIPTION OF THE DRAWINGS

These and other objects, features and advantages of the present invention will become apparent upon a consideration of the following detailed description of the invention when read in conjunction with the drawings, in which:

FIG. 1 shows one prior art scheme for locating a byte or word boundary in a serial bit stream.

FIG. 2 shows another embodiment of a prior art scheme for locating a byte or word boundary in a serial bit stream.

FIG. 4.1 and 4.2 are schematic diagrams of a marc specific embodiment of the system for locating a byte or word boundary according to the present invention.

FIG. 6 shows the embodiment of FIG. 5 wherein the serial bits are first deserialized to a two bit wide parallel bit stream using two half-rate clocks.

FIG. 7.1 shows the basic structure of an embodiment of a deserializer according to the present invention.

FIG. 7.2 shows the functional logic blocks of an embodiment of a deserializer according to the present invention showing all interconnecting lines and input/output lines.

FIG. 11.1 shows the circuit diagram of the complementary comma detection system for the deserializer of FIG. 7.2. It includes a power saving feature.

FIG. 11.2 shows the circuit diagram for a single polarity comma (0011111) detection system for the deserializer of FIG. 7.2.

DETAILED DESCRIPTION

Prior art means use circuits having a switching speed corresponding to the bit rate to identify a comma or byte boundary (also referred to herein as an indication of data location boundary). Therefore, the present invention uses substantially less expensive circuits and thereby the conversion means is substantially less expensive. When a bit stream is deserialized, the beginning of a word must be identified to properly deserialize the data. This invention is directed to transmission of data over a communication line or channel which transmits data from a first location as serial bits to a second location where the bits are deserialized. At the transmission point, a marker (comma) is periodically placed in the bit stream. This marker is searched for at the receiving location to properly align the bits into a parallel format. According to the present invention the circuitry to search for this marker runs at a fraction of the data rate.

Figure 3:
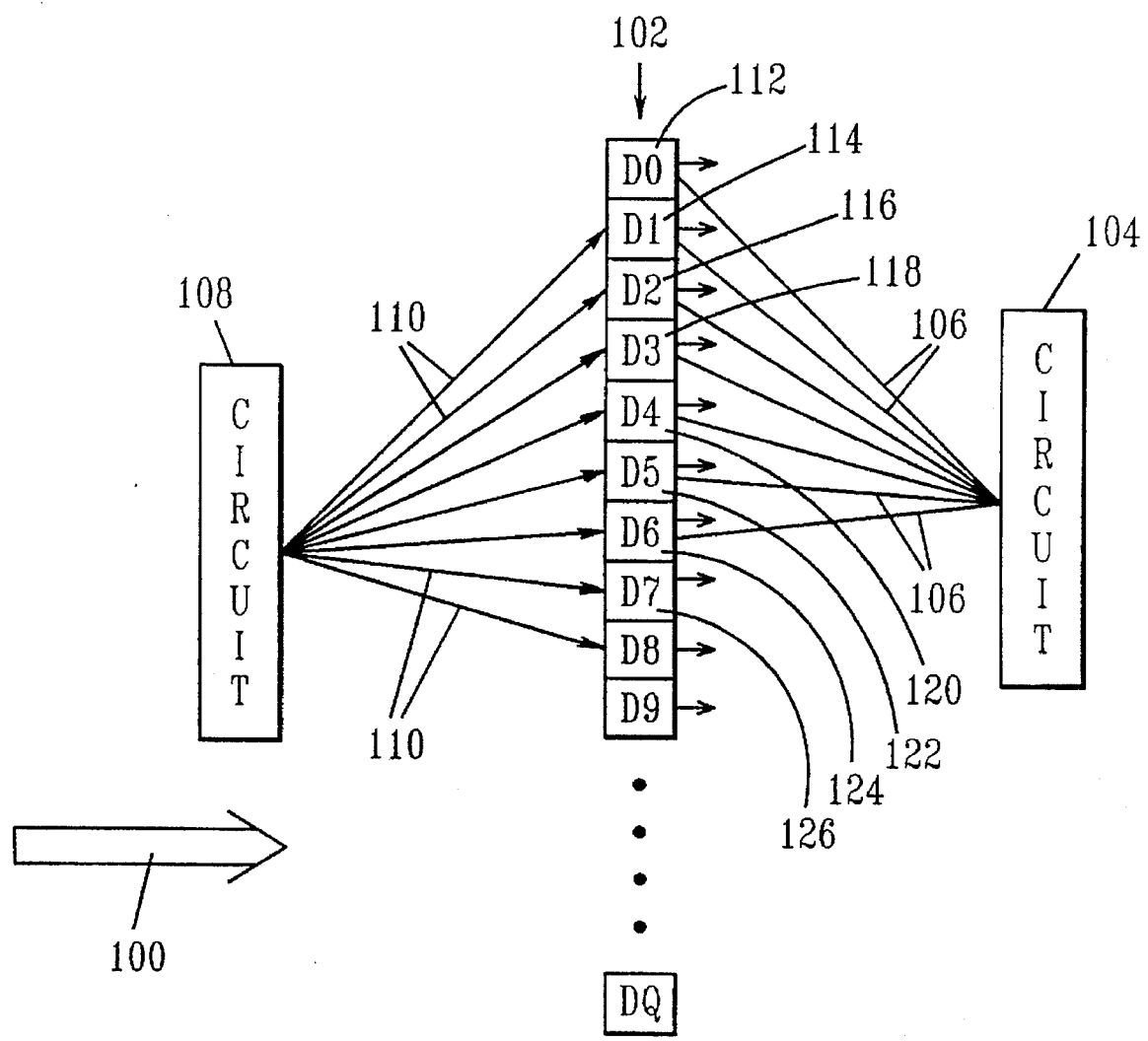
FIG. 3 is a schematic diagram of the system for locating a byte or word boundary according to the present invention.

Turning now to the Figures, FIG. 3 schematically shows the system for deserializing and for identifying the comma in a parallel bit stream according to the present invention. Input serial bit stream 100 is deserialized into parallel bit stream 102 composed of Q bits D0, D1, DQ. For simplicity, the comma is assumed to be 7 consecutive bits. There are a plurality of circuits and lines, only 2 of which are shown in FIG. 3, circuit 104 and lines 106, and circuit 108 and lines 110, for identifying the comma. Circuit 104 is connected by lines 106 to memory locations 112, 114, 116, 118, 120, 122 and 124 which contain data D0, D1, D2, D3, D4, D5 and D6, respectively. Circuit 108 is connected by lines 110 to memory locations 114, 116, 118, 120, 122, 124 and 126, which contain data D1, D2, D3, D4, D5, D6 and D7, respectively. There can be other circuits and lines, such as 104, 108, 106 and 110, for monitoring a third, fourth, fifth, etc. group of seven consecutive bits for locating the comma in the parallel bit stream 102. The comma is identified by one of the circuits such as 104 or 108. The system is set to read out the bits from that circuit and a clock is set to select an appropriate read-out time between successive reloading of the parallel group 102.

FIG. 3 shows the memory cells in one parallel group 102. In the preferred embodiments, the necessary number of memory cells is generally distributed over more than one parallel group of width Q as shown in FIG. 4.1. For this embodiment, the total required number of memory cells M amounts to M Q+Q+C−1, where C is the size of the comma in bits. In FIG. 4.1, input bit stream 200 is deserialized into a Q-wide parallel bit stream. Parallel group 202 is the first group of Q-wide parallel bits, and 204 is the last group off Q-wide parallel bits. The three dots 206 indicate that there are N-2 additional Q-wide bit sets between the first and the last set of Q parallel cells 202 and 204, respectively. A certain number M of consecutive bits of data between bit B and E are monitored by N sets of logic circuits to identify the comma. The comma is made up of C consecutive bits. Between bit B and bit E there are N groups of C consecutive bits where N=Q. Each of the N circuits monitors a set of C contiguous bits which is one bit cell displaced from the next preceding set of C bits. The first bit of the first of the N groups corresponds to bit E, and the last bit of the last group corresponds to bit B. The N groups of C consecutive bit cells are simultaneously monitored to locate the comma. When the comma is located, the bits are read from Q consecutive data storage locations starting with the first bit of the comma. An rQ wide parallel bit stream can be created by reading a 1st set of Q bits, transferring these Q bits to the first Q cells of an rQ wide register, waiting Q bit periods, reading a second set of Q bits and transferring them to the second set of Q bits of the rQ wide register. This is repeated until rQ bit times later the last set of Q bits is transferred into the rth (last) Q cells of the parallel register of rQ size.

In the embodiment of FIG. 4.2, Q bits from the serial bit stream are stored in the first Q-wide register 204. These bits are transferred to the second Q-wide register, and the next Q bits from the serial bit stream 200 are stored in the first Q-wide register 204. This is repeated until all N Q-wide registers are filled with data. If M divided by Q is net an integer in the embodiment of FIG. 4.2, then just a number of bits equal to the remainder is stored in the high order positions of the last Q-wide register.

Figure 5:
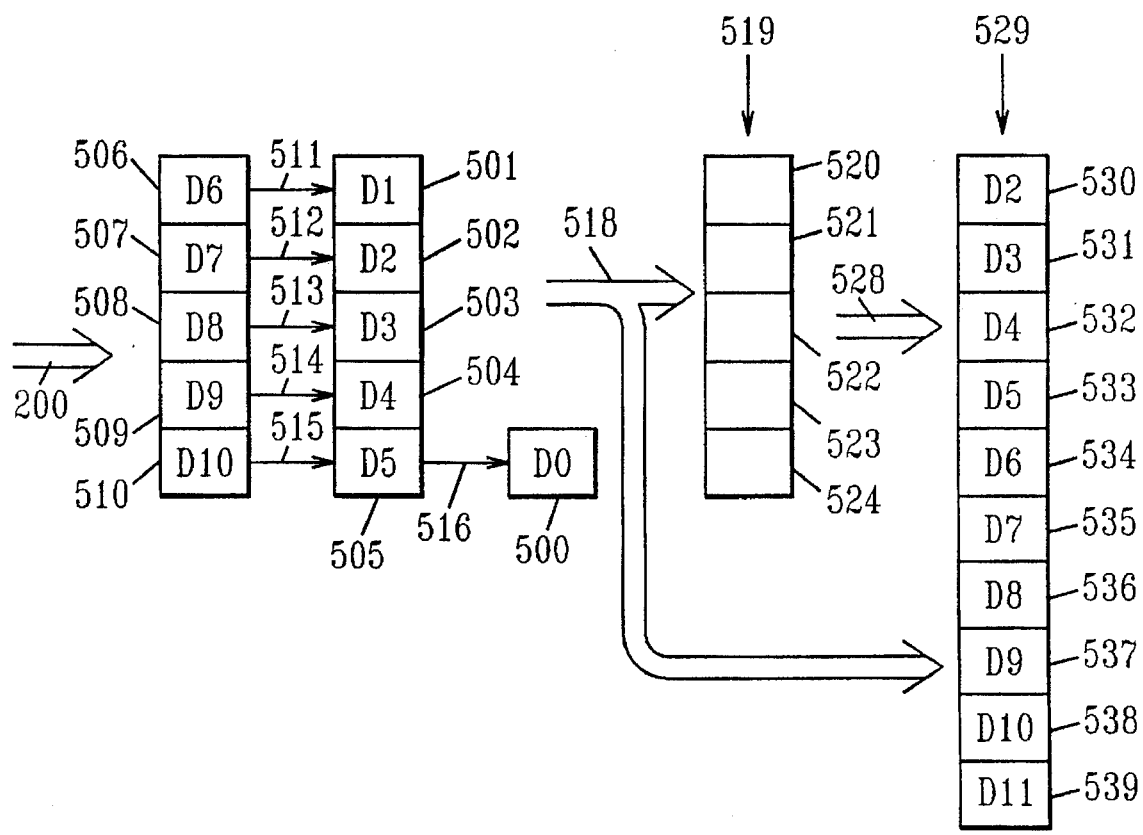
FIG. 5 is a shows a specific embodiment of the system for identifying a byte or word boundary according to the present invention wherein the comma has seven bits and wherein the serial bits are deserialized to a 5 bit wide parallel bit stream.

FIG. 5 shows an embodiment wherein serial bit stream 200 is deserialized into first a 5-wide parallel bit stream and then into a byte-aligned 10-wide stream. The comma size is 7 consecutive bits, therefore the number of required storage cells is obtained from the equation M=Q+C−1=5+7−1=11. Eleven storage cells 500, 501, 502, 503, 504, 505, 506, 507, 508, 509 and 510 store data D0, D1, D2, D3, D4, D5, D6, D7, D8, D9 and D10, respectively, to identify a 7-bit comma in 5 different locations. Five bits from the serial bit stream are first stored in the memory cells 506, 507, 508, 509 and 510. These five bits are shifted to memory cells 501, 502, 503, 504 and 505 as indicated by arrows 511, 512, 513, 514 and 515 respectively. The bit in memory cell 505 is shifted again to memory cell 500 indicated by arrow 516. The bits in memory cells 501, 502, 503 and 504 are shifted out. The contents of five groups of seven consecutive memory cells are used to identify the comma. The five groups are N0, N1, N2, N3 and N4. The contents of the five groups are monitored simultaneously. When the comma is located, for example in group N2, the 5 bits D2 to D6 are read out from memory cells 502, 503, 504, 505 and 506 and transferred in a boundary aligned format as indicated by arrow 518 to the five cells 520, 521, 522, 523, and 524 of a 5-wide synchronous register 519 and replaced by a new set of 5 bits corresponding to the next five bits D7 to D11 of the serial bit stream. Five bit periods later, the first set D2 to D6 is transferred to the low order part 530 to 534 of a 10 bit register 529 as indicated by arrow 528 and simultaneously, the new set of five bits is transferred directly from the memory cells 502, 503, 504, 505 and 506 to the high order positions 535 to 539 of the 10-bit register 529 as indicated by arrow 518.

Group N0 includes memory cells 500, 501, 502, 503, 504, 505 and 506

Group N1 includes memory cells 501, 502, 503, 504, 505, 506 and 507

Group N2 includes memory cells 502, 503, 504, 505, 506, 507 and 508

Group N3 includes memory cells 503, 504, 505, 506, 507, 508 and 509

Group N4 includes memory cells 504, 505, 506, 507, 508, 509 and 510

FIG. 6 shows the embodiment of the deserializer wherein input serial bit stream 200 is first deserialized into two parallel bit streams 600 and 602, as described in U.S. Pat. No. 5,301,196 and then the two wide parallel bit stream is transformed into the five wide parallel bit stream 624. Numerals common between FIGS. 5 and 6 represent the same thing. Commonly used deserializers use a clock 615 which has a frequency which corresponds to the rate of the input bit stream 200. In FIG. 6, the rise 618 of clock pulse 619 corresponds to the center 622 of bit D0, and rise 626 of clock pulse 628 corresponds to center 623 of bit D1. Each additional rise of each subsequent clock pulse corresponds to the center of a bit in the succeeding bits of the input bit stream. In the present invention, a plurality of clocks are used to reduce the data rate into a plurality of parallel steams of bits. In the preferred embodiment of FIG. 6, a clock recovery and sampling circuit similar to the one described in U.S. Pat. No. 5,301,196, the teaching of which has been incorporated on page 1, provides the 2 half-rate data steams 600 and 602 together with the two half-rate clocks 630 and 632 with a suitable phase relationship. Each half-rate clock operates at one half the rate of the input bits. Half-rate clocks use slower circuits than full-rate clocks and are therefore less expensive. The two half-rate clocks 630 and 632 combined simulate the effect of the single full-rate clock 615.

Each pulse of the half-rate clocks 630 and 632 picks off a bit from the related bit stream 600 or 602 and places it into the shift registers 640 and 642, respectively. At a certain bit interval later, the bits D0, D1, D2, D3, and D4 are all present in shift register cells clocked by clock 630 in the configuration shown in the registers 640 and 642. They are then transferred in unison into a 5-wide register 624 by the clock 633, which is congruent with clock 632 except that after every pulse, 4 pulses are missing. Five baud intervals later, the bits D5, D6, D7, D8, and D9 are in the cells shown in registers 640 and 642. This set of cells is clocked by clock 632. This second set of 5 bits is shifted into register 624 by clock 634, which is a copy of clock 633, except that it is delayed by 5 bit intervals and its pulses are congruent with clock 630. The selection can be made via five appropriately gated AND-OR circuits in the data path to the data input of single port latches 506, 507, 508, 509, and 510. The 2 clocks 633 and 634 are then OR'ed to generate a pulse every 5 baud intervals before application to the clock inputs of the latches. Alternatively and preferably, the latches 506 to 510 are implemented as 2-port latches as shown in FIG. 6.3. A 2-port latch has a separate data and clock input for each port. The data D0 to D4 are then, directed directly to port 1 together with clock 633, and the data D5 to D9 together with clock 634 are connected to port 2. The data in register 624 is shifted to the right at a rate equal to one fifth of the serial bit rate (the required intermediate latches between the columns are not shown in FIG. 6.3). At some point in time, the original serial bits D0 to D9 may appear at the locations shown in register 624. Another, preceding bit D-1 resides in cell 500. The shift rate of register 624 is low enough to perform the logical functions of comma detection with comfortable timing margins between steps. Note that the bit numbering of FIG. 6 is arbitrary and has no relationship to the byte boundaries. The embodiments of FIGS. 5 and 6 are described in detail below.

The invention is applicable to various coded bit structures. For links coded in 8B/10B code, the serial bit stream is consists of consecutive 10 bit blocks that are sometimes further grouped into 2 or 4 byte words of 20 or 40 coded bits. For clarity, the invention will be described with reference to transit, fining an 8B/10B coded serial bit stream into a two byte wide (20 bit) data stream which is aligned with the byte and word boundaries. To achieve the maximum data rate for a given technology with solid design margins, it is desirable to minimize the number of high speed circuits and to move most functions, such as synchronization, into the domain of low speed circuits. Since bytes coded into ten bits are our basic data unit, the preferable factors for expansion besides ten are two and five. Because one factor is odd, some complications arise, which are not found in common carrier type multiplexers and demultiplexers, which generally have a modulo two structure.

The data stream is expanded from a one-bit width in the postamplifier to two bits wide in the retiming circuits by having separate sampling flip-flops for alternate bits. The two-bit streams +DX and +DY of FIG. 7.2 operate at half the serial rate and are offset in time relative to each other by one bit time. The term 'bit time' refers to the bit period as seen in the serial link, i.e. it is 1 ns for a 1 Gb/s link. The signals +DX and +DY with the companion half rate clocks +CB0A and +CB1A represent the input to the circuit complex described here.

Several techniques are known for the alignment of a serial bit stream with the byte and word boundaries. This design assumes the presence of an explicit singular synchronizing sequence in the encoded bit stream, which will be referred to below as the comma. A single comma identifies the byte and word boundary unambiguously in the absence of transmission errors. The system of the present invention is able to synchronize on just one such comma and to transfer the very same comma to the output with correct word boundary alignment. Some systems according to the present invention might use several commas, or the data might be aligned starting with the byte following the comma. There are also differences in how synchronization is initiated. This system operates in the explicitly enabled word alignment mode: Changes in word boundary alignment are allowed only in response to an external control line, and then only a single alignment on the next occurring comma. Other systems, according to the present invention, operate in continuously enabled word alignment mode, also referred to as 'hot sync', i.e. a realignment is made anytime a non-aligned comma is detected. In most cases this will be a spurious comma generated by a transmission error. The system, according to the present invention, can be modified to do continuous mode alignment.

For the actual word alignment two methods are widely used. The first method keeps the read-out location from a serial bit rate register constant and adjusts all clocks to fit the time when a full byte appears in a certain location. This technique can potentially provide the minimum latency and a minimum number of circuits, but places higher demands on the technology, and it is difficult to avoid glitches in the clocks during the synchronization process; also, this method is complicated in the case of dual half rate serial registers, unless the synchronization can be done in two steps. Another method is to leave the clocks alone and change the location of the data tap from the serial register which usually is extended to a length of at least 2 bytes. Apart from the increased latency, the more serious disadvantage is the inflation of the number of high speed circuits and the heavy loads on clock and register circuits that slow down the operation and increase the power consumption. The system described herein uses elements of both methods, but avoids or reduces their disadvantages.

Deserializer Block Diagram, DESERIAL2B

The drawing of FIG. 7.1 shows the structure of the deserializer. The decade counter controls the timing of all events. It runs as an independent timer slaved to the rate of the incoming bit streams. It is never reset and has an arbitrary relationship to the byte boundaries in the incoming bit stream.

Data may be received from retiming circuits on a single line and is then shifted into a serial shift register operating at the full rate, or preferably split into 2 serial registers operating at half the rate. The preferred mode is to receive all odd numbered bits on one line and all even numbered bits on a second line, and to feed both lines to separate serial registers operating each at ball the full rate as seen on the transmission line. Regardless of the configuration, the registers must be large enough to allow the readout of 5 consecutive bits at a time at intervals of 5 bit periods. The readout is controlled by the decade counter with no regard to the byte boundaries.

The sets of 5 bits are transferred to 5 synchronous serial registers with enough cells to accommodate 11 different bits at a time.

The comma detection circuitry, if armed, continuously monitors the 5-wide serial register for the presence of the 7-bit comma in five possible locations, each displaced by one bit position from the preceding one. If a comma is detected, a set of five 5-way AND-OR gates is controlled such that sets of 5 bits are transferred into a synchronous 5-wide register properly aligned along 5-bit boundaries, i.e. the first cell will alternately be fed the first and fifth bit of a 10-bit byte. From there, boundary aligned bytes are assembled in two 10-bit registers in ping-pong fashion.

The comma detection circuitry is activated by a synchronization control circuit that responds to an external enabling input. This circuit also controls the timing of the data transfers into the 10-bit registers and the word clock output (CVB). These timings may be modified in response to a recognized comma. Upon resynchronization the timing may remain unchanged or it is modified in one of only 3 possible alternatives. These changes are reflected in the output word clock as a stretching of an up level interval by 10 or 15 bit periods, or by the extension of the down level by 5 bit periods. The transitions in the clock output are always at least 10 bit periods apart, which is the nominal value.

When a comma is recognized in the 5-wide register, the first five bits of that comma character are forced with the correct polarity into the output registers, bypassing the normal data transfer to allow the readjustment of the Select Gates with comfortable timing margins.

The drawing of FIG. 7.2 shows the detailed logic blocks of the deserializer together with all their interconnecting lines and input/output lines.

The decade counter DESCLK10 generates the basic clocks at the 1/5 and 1/10 bit rate in a variety of phase relationships and pulse widths from a pair of non-overlapping clocks operating at half the serial bit rate.

The serial register SERREG receives the half rate data streams +DX and +DY and feeds them into short serial registers with 5 polarity-hold latches each to provide simultaneous access to 5 bits for expansion to a 5 bit wide data stream. Because all even numbered bits propagate through one of the serial registers, and all odd numbered bits through the other one, consecutive 5 bit groups must be read from alternating shift cell locations under control of five AND-OR gates.

The five bit wide register DES5QREG accepts 5 bits at a time from SERREG and shifts them at one fifth the serial link rate. This register preferably gives simultaneous parallel access to 11 bits at a time to check for a seven bit long comma in five different locations.

DESCLC10, SERREG, and DES5QREG operate at all times with arbitrary relationships to byte and word boundaries.

The comma detector COMMAC examines the data passing through DES5QREG for the presence of a comma in five possible locations. When the synchronization circuitry is enabled, the location of the comma is recorded by the setting one of five latches.

The circuit block SYNC2BYTE controls the byte and word synchronization process and the byte and word clock timing. The deserializer is armed for comma detection if the external control line ENBYSNC changes to the asserted state from the inactive state. The circuit SYNC2BYTE will then cause the circuit COMMAC to record the location of the next comma appearing in DES5QREG, and will itself record the time of the comma appearance relative to the decade counter DESCLK10. It will stretch the word clock +CVB to align it with the new output data transfer timing, and it will set up the required internal clock timing for the transfer of word aligned data from DES5REG to the output registers in DES5Q20QC.

The circuit block SELCTOUT transfers alternately the first and second half of a byte to the output registers in DES5Q20QC from a location in DES5QREG selected by COMMAC.

The expansion of the data flow from the 5 bit wide, boundary aligned format at the output of SELCTOUT to a width of 20 bits is shown in DES5Q20QC.

The circuit block DESPAR is an optional function. It generates an odd parity bit from the data just after entry into SERREG. The parity can be used to monitor the proper operation of most of the deserializer.

It is assumed that any CMOS implementation would use an LSSD-based test strategy. If all latches shown are given a companion 12 latch, we end up with what is called a single latch LSSD design.

For LSSD testing purposes the primary clock inputs +CB0A and +CB1A are separate from +CB0B and +CB1B; in actual operation +CB0A is common with +CB0B, and +CB1A is common with +CB1B.

Logic Macros

The details of the logic depend of course on the type of gates available in a particular technology. Changes in detail, rather than in the basic circuit structure, may be needed to optimize the circuit margin and power for a particular technology at a given data rate. The circuits shown use no gates with a fan-in larger than 4.

All latches are of the polarity hold type and may include an L2 latch for LSSD-based test methods. The inputs and the output for the L2 latch are not shown.

The ^ symbol inside some AND and AND-OR gate bodies refers to the tipper gate of dual gate or slacked FET implementations. This input is in some logic circuit families faster than the lower gate; also, if the upper transistor gate of an AND gate is held off, a subsequent OR gate may operate faster because of reduced parasitic loads. The logic circuit wiring shown takes advantage of this feature, where applicable.

Clock Notation

The signal names of all clocks start with the letters CB, CD, or CV. Note that the clocks CD*W, where * is a number from 0 to 9, are just data rather than clocks in LSSD terminology. The meaning of the letters in clock names are as follows:

The letter B, For binary, identifies all half rate clocks. The letters D and V suggest a cycle time of 10 and 20 bit intervals, respectively.

The letter W, for wide, near the end of a clock name indicates, that the clock pulse is at the tip level for two bit times. As an example, +CD1W is at the up level during decade bit time CD1 and CD2.

All LSSD clock names end with the letter A or B, which indicate a dependency on either the primary clock pair +CB0A/+CB1A, or +CB0B/+CB1B, respectively. Note that according to LSSD design rules, a latch with a data input from another latch, which is timed by a first clock, must be timed by another clock at all times, including the start up where the decade counter may still be in an abnormal state.

CD3/8; The / indicates that the clock is up at both time CD3 and time CD8.

CD1X6: The X indicates that the clock is up at time CD1 or CD6, depending in the synchronization status (level of +X and −X in FIG. 12). IF +X is up, then +CD1X6 is up at time CD1, otherwise at time CD6. The signal +X goes up if during word synchronization a Comma is detected by the clock +CD1.

Figure 8:
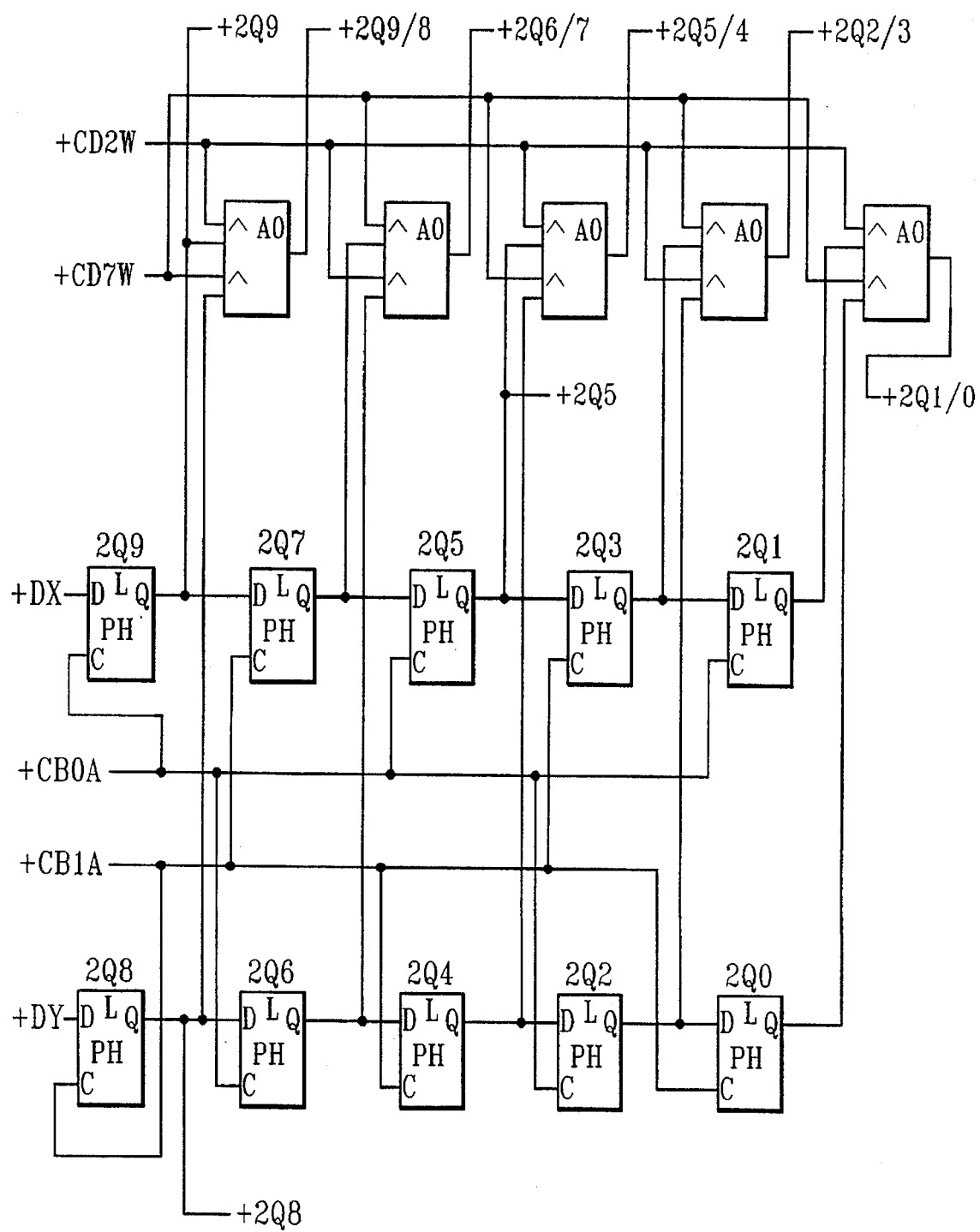
FIG. 8 shows a circuit diagram of the serial 2-wide register of the deserializer of FIG. 7.2.

Serial Register, SERREG, FIG. 8

The input data is sent from the retiming circuitry on two lines labelled +DX and +DY, which are clocked at one half the bit rate. Sequential bits alternate on +DX and +DY and the relative timing of DX and DY is offset by one bit time. Note that for a 101010 serial bit pattern one of the lines will be at a steady up level and the other line at a steady down level. The data is clocked alternately by +CB0A and +CB1A into two serial registers consisting of 5 latches each. The primary clocks +CB0A and +CB1A must be non-overlapping and must be aligned such that the data is read into the first latch of each of the two serial registers with adequate timing margins; in particular the timing of the failing clock edge relative to the data at the input of the latches 2Q8 and 2Q9 must be carefully monitored to guarantee that the data is read always correctly and that the data valid window at the output of latch 2Q9 and 2Q8 is not shortened. For an illustration of the timing relationships refer to the top of of FIG. 15.

In a first string of 5 latches, bits originating from +DX can be accessed at 2Q9, 2Q7, 2Q5, 2Q3, 2Q1; the +DY bits propagates through a second string of latches 2Q8, 2Q6, 2Q4, 2Q2, 2Q0. Each bit remains in a latch for 2 bit times and is copied to the next latch after one bit time.

The five AND-OR gates at the top of the drawing FIG. 8 pick 5 consecutive bits at a time for transfer to the 5 bit wide register DES5QREG. Because the number of bits is odd, the read-out from a 2 wide register must alternate in terms of read-out location or read-out timing.

With constant read-out location, but varied timing, successive quintets of bits must be transferred an even number of bit times apart, e.g. at time 2 and 8, i.e. alternately 6 and 4 bit times apart; For that approach to work, the left column of 5 latches in DES5QREG must be upgraded to a master-slave flip-flop, which also adds latency for the data to propagate through the deserializer.

Figure 10:
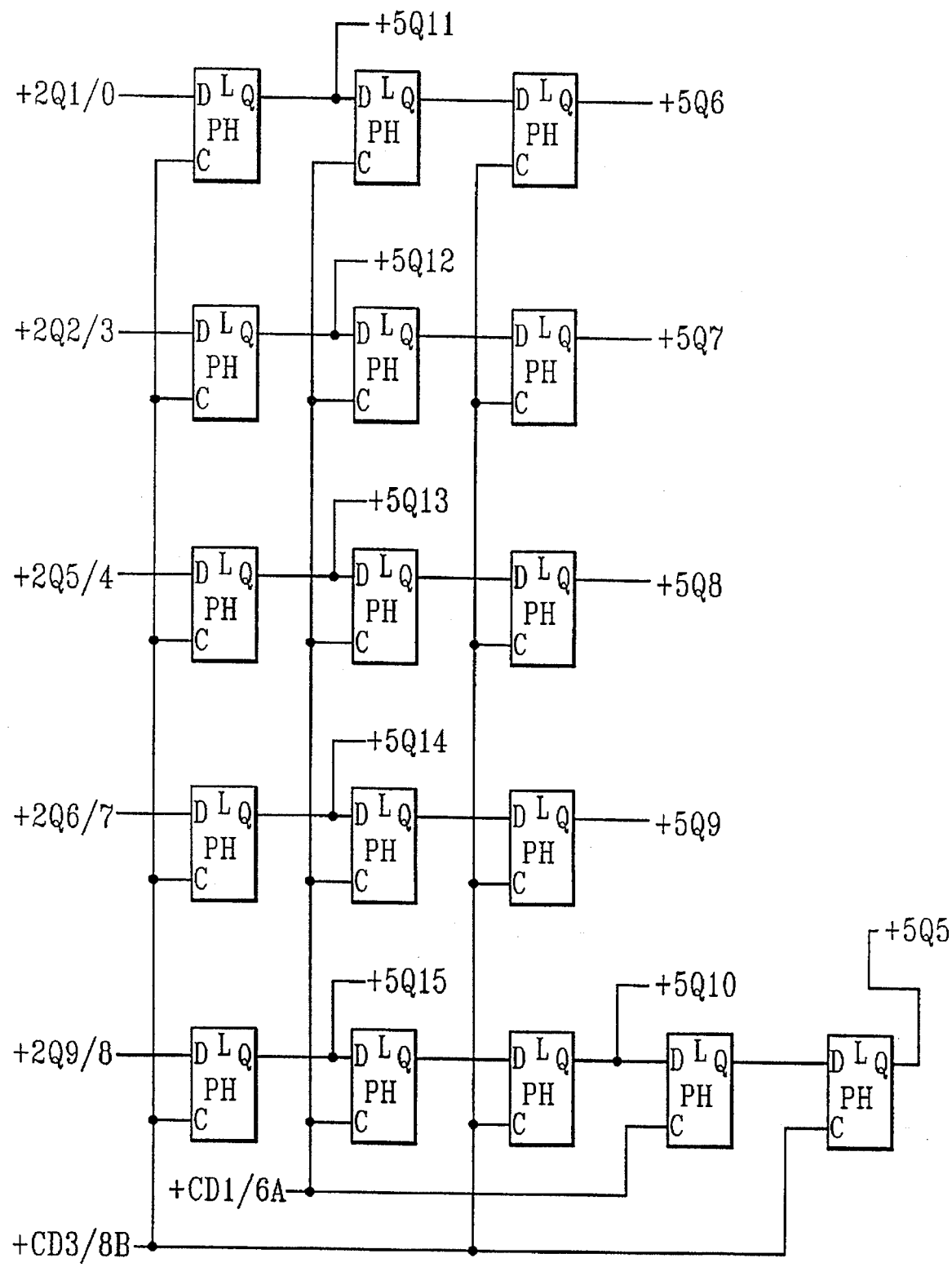
FIG. 10 shows the 5 bit wide register for the deserializer of FIG. 7.2.

Constant timing with varied location as shown on in FIGS. 8 and 10 generally results in a better timing margin, less latency, and fewer circuits. A first set of five consecutive bits is selected from 2Q0, 2Q3, 2Q4, 2Q7, and 2Q8 by clock +CD7W and sampled in DES5QREG at time +CD8; the second set is selected from 2Q1, 2Q2, 2Q5, 2Q6, and 2Q9 by the clock +CD2W and sampled at time +CD3

Figure 9:
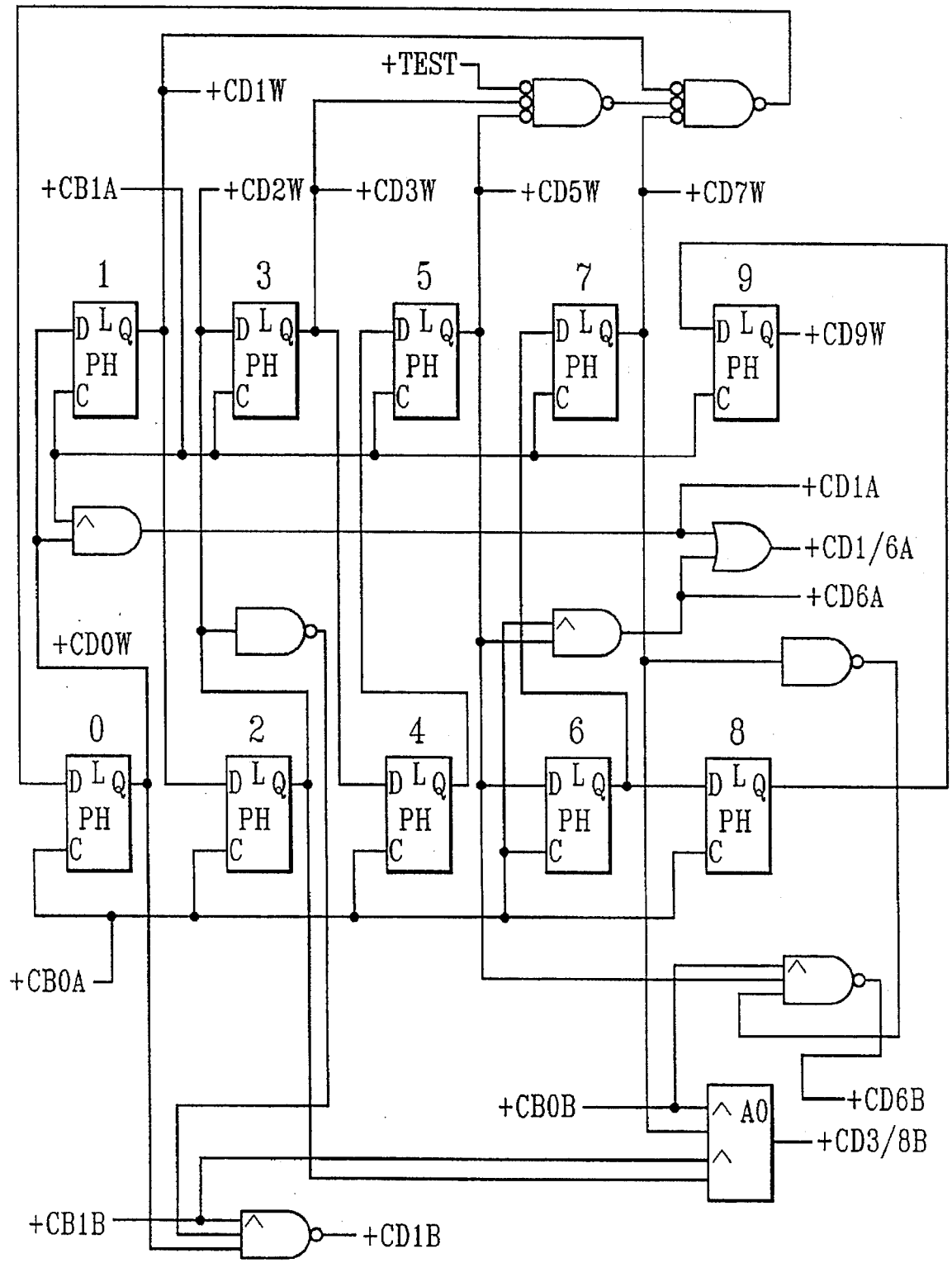
FIG. 9 shows the decade counter and secondary clocks derived from it of the deserializer of FIG. 7.2.

Decade Counter, DESCLK10, FIG. 9

The decade counter has the form of an open ring, which is self-correcting; it controls all the timing in the deserializer.

The DESCLK10 circuit is described in 'Self-starting Open Ring Timing Circuit', IBM Technical Disclosure Bulletin, Vol. 35, No. 5, October, 1992, p. 446, the teaching of which is incorporated herein by reference.

Figure 17:
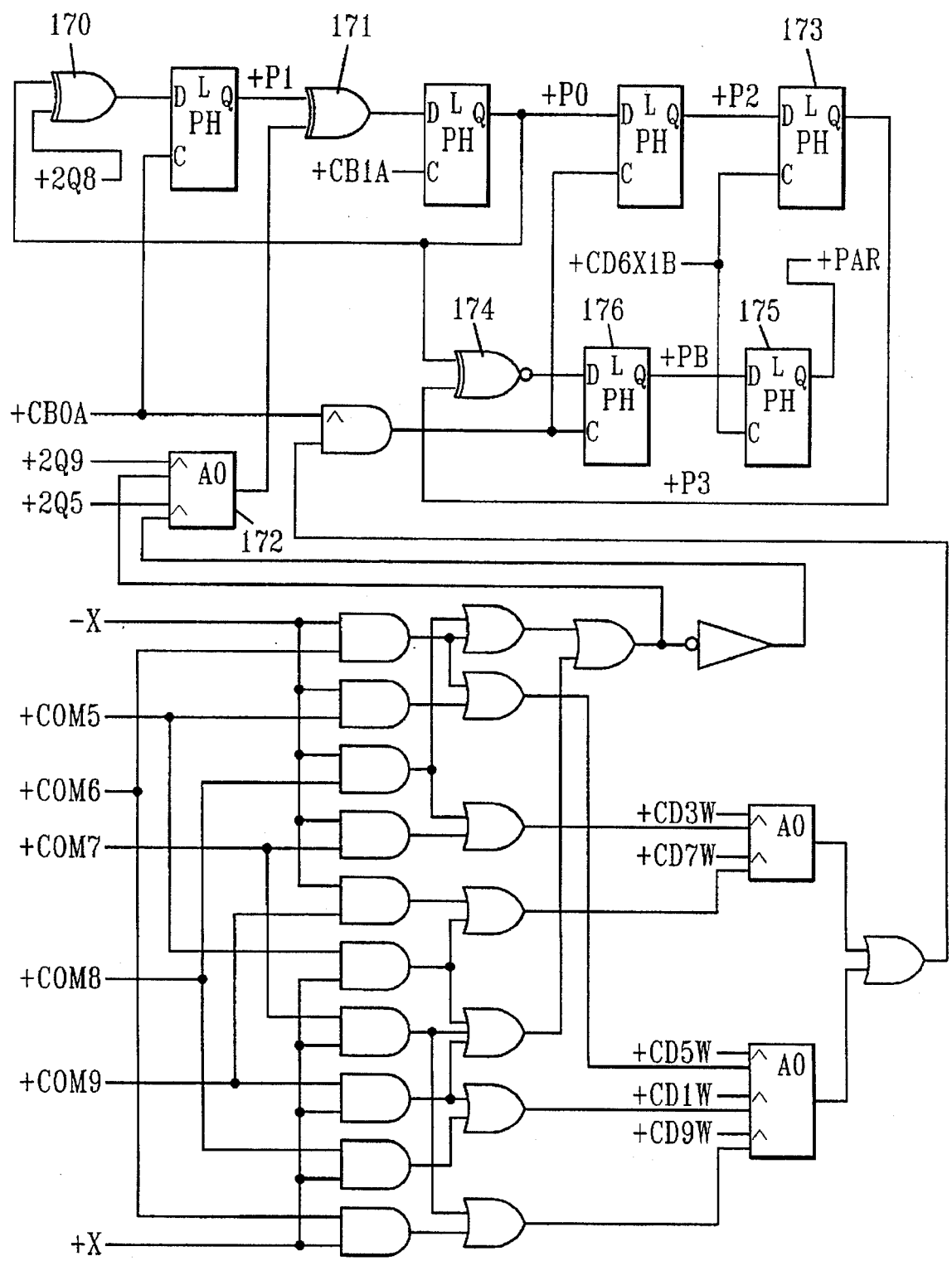
FIG. 17 schematically shows a parity generator circuit for the deserializer of FIG. 7.2.

Note that latch 8 and 9 can be omitted, if the optional DESPAR circuit of FIG. 17 is not included.

A significant feature of the deserializer design is that the basic timing circuit DESCLK10 does not have to be reset on synchronization, which would impose a speed penalty.

The input line +TEST can be used to open the feedback loop and suspend the forcing of a one bit into the first latch 0. The signals +CD1W and +CD7W are in the critical delay path of the feedback loop, and are for this reason applied to the second gate at the top right of FIG. 9. For the same reason the fan-in of that gate has been minimized.

The gate at the lower left corner of FIG. 9 which generates +CD1B has the complement of +CD2W as an extra input that serves no function in normal operation. This input is required to bring the circuit SYNC2BYTE of FIG. 12 in compliance with LSSD rules. The gate +CD6B at the lower right side of FIG. 9 has an extra input as well, the complement of +CD7W. These extra inputs insure that both +CD1B and +CD6B are at the down level, when +DC3/8B is at the up level, even if all the latches of DESCLK10 are at the up level during initialization; this is preferred because in SYNC2BYTE, the clocks +CD1B and +CD6B are gated by outputs from latches which are clocked by +CD3/8B, and the two interconnected latches CVA and CVB are clocked by +CD6X1B and CD3/8B, respectively.

Five Bit wide Register, DES5QREG, FIG. 10

The size of 11 cells for register DES5QREG is preferred in order to look for the 7 bit comma in 5 different places. As described under SERREG above, the left column of 5 single latches 5Q11 to 5Q15 is loaded with new data at time CD3 and CD8. The delay of the AND-OR gates in SERREG is compensated by a comparable AND-OR delay for the generation of the clock signal +CD3/8B in DESCLK10, which improves the timing margin for the data transfer.

Figure 15:
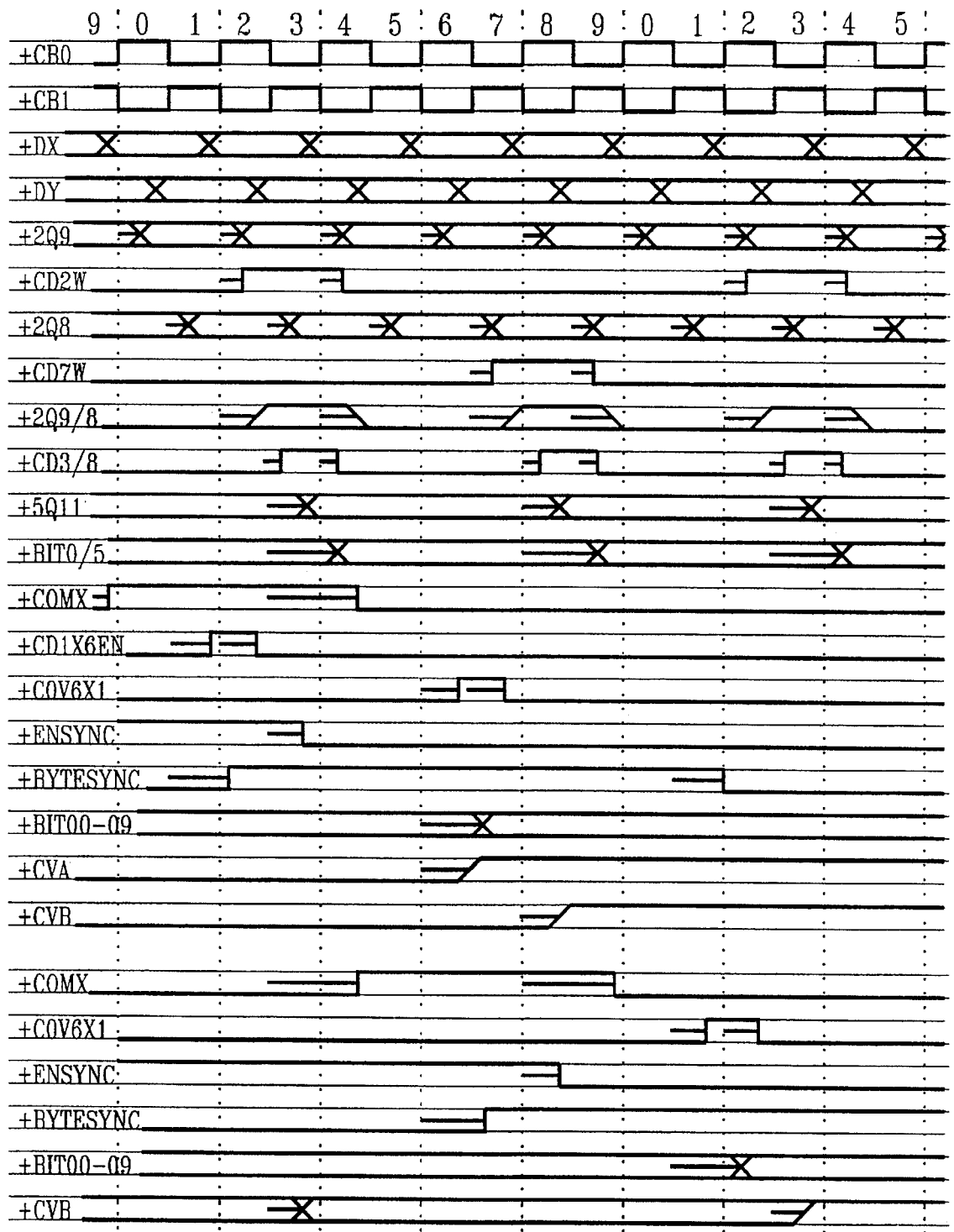
FIGS. 15 and 16 show timing charts for the deserializer of FIG. 7.2.

For an illustration of the timing of this data transfer, refer to the upper half of FIG. 15. The diagram assumes a delay of 0.4 of a bit time from the clock input to the data output of a latch, and a delay of 0.3 of a bit time for an AND-OR circuit. The horizontal line at the half level preceding a transition shows the total delay relative to the reference clock causing the transition.

At time CD1 and CD6 the data is transferred to the master latches in the second and the fourth column. All available outputs 5Q5 through 5Q15 are updated synchronously at intervals of 5 bit times by the clock +CD3/8B.

Note that the logic diagram shows identical master and slave latches, the distinction is purely functional, but for some technologies different implementations of the master and slave latches may be preferred to realize power and area savings.

Complementary Comma Detection, COMMAC, FIG. 11.1

The design shown here recognizes and can synchronize on the complementary comma sequences '0011111' and '1100000' of the 8B/10B transmission code of U.S. Pat. No. 4,486,739. However, it is sufficient to just recognize the sequence '0011111' in some applications of the code, resulting in circuit savings. The first bit of either bit sequence is always coincident with the first bit of a word.

The 7 bit complementary comma detection in FIG. 11.1 is done by 2 stages of gating. The first stage consists always of 3 ; gates, e.g. gate 110, 112, and 114, some of them shared, with a combined data fan-in of 7. For the implementation shown, each gate has an additional optional input COMEN to prevent switching in a dormant mode as explained below. The second stage is a 3-way-AND/2-way-OR gate, e.g. gate 116. Alternate structures with fewer gates can readily be found, but they tend to be slower because of gates of increased fan-in and have less uniform delay path lengths, which are less suitable for high speed operation. Another gate count reduction is possible by providing true and complement outputs from DES5QREG, at the cost of an increased number of wires and buffer drivers.

Figure 12:
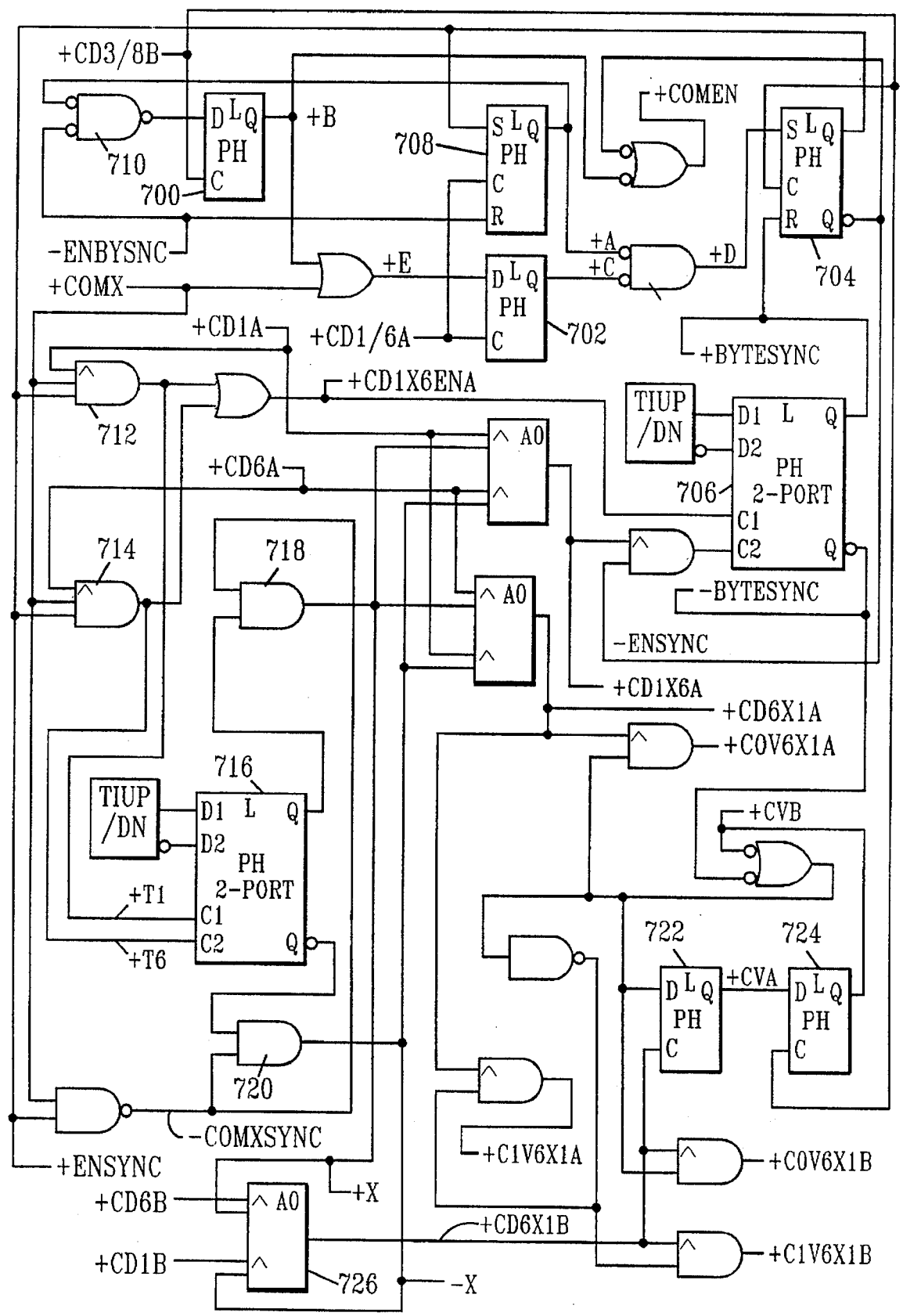
FIG. 12 shows a circuit for the control of the comma detection system and for the synchronization of the byte and word clocks of the deserializer of FIG. 7.2.

For circuit technologies such as CMOS, almost all of the power drain occurs during switching. Since the COMMAC circuits are needed only infrequently for very short periods of time, an optional control line +COMEN enables the circuits as required, and otherwise keeps them from switching. For deserializers which are compatible with the unrestricted use of the K28.7 comma character (0011111000 or 1100000111) (Ref.: U.S. Pat. No. 4,486,739) the gates above must be enabled before the byte synchronization circuits of FIG. 12 are activated. As shown in FIG. 11, the comma circuits are enabled by a signal +COMEN which is generated for this purpose in SYNC2BYTE. For deserializers without the K28.7 feature, the comma circuits can be enabled by the signals ±ENSYNC from latch 704 of FIG. 12. The extra fan-in for these controls may be a burden in very high speed applications; we may then refrain from turning off the gates 114, 118, 120 and 122 of FIG. 11.1 which have the largest fan-in. This results in a uniform fan-in of 3 for all gates and a uniform delay path, while most of the power savings remains intact.

The output +COMX is up, if the COMMAC circuitry senses a comma in any one of five possible locations of DES5QREG. If comma synchronization is enabled and +COMX is asserted, one of the five latches (COM5, COM6, COM7, COM8, or COM9) will be set at time CD1 or CD6. It is not possible at any one time to see a comma in more than one place, thus the other four latches will be reset automatically. The comma sampling by clock +CD1X6ENA will force the line +COM5 up, if the first bit of a comma resides in the latch 505 of FIG. 10. An equivalent relationship exists between +COM6 and 5Q6, COM7 and 5Q7, and so on. Once set, the +COM5 to +COM9 outputs remain, until a different state is forced because of another synchronization process; these lines control the gating of the data through SELCTOUT (FIG. 13) into the latches of DES5Q20QC (FIG. 14) with proper half-byte alignment.

Control of Synchronization and Byteclock, SYNC2BYTE, FIG. 12

The circuit complex SYNC2BYTE, FIG. 12, controls the byte and word synchronization process and the alignment of the word clocks. The circuit shown is for a 2 byte receiver data interface. A similar, but less complex circuit is required for the single byte interface version.

The circuitry at the top of FIG. 12 accepts an external command for resynchronization and stops further synchronization attempts after the first comma has been received. It is the responsibility of the attached communications adaptor to determine synchronism via code error monitoring and to initiate resynchronization via the –ENBYSNC line. A first latch 700 at the top left serves to synchronize the external request for synchronization with the internal clocks and to activate the COMMAC circuits. A second latch 702 in the center is used to delay the start of the comma search if there is currently a comma present in DES5QREG (FIG. 10). The latch 704 at the top right, if set, enables the actual comma search. The two-port latch 706 just below indicates when a comma has been recognized. The latch 708 at the top center prevents the recognition of more than one comma, even if the external control line is not deactivated.

The reason for inhibiting the arming of the circuit when a comma is present in DES5QREG (FIG. 10) is to prevent synchronization on a possible false comma across the trailing byte boundary of the K28.7 comma character, i.e. '0011111000'00. . . or '1100000111'11. . . (U.S. Pat. No. 4,486,739). Such bit sequences are generated if the K28.7 character is followed by unrestricted data control bytes. The false comma follows the true comma by 5 bit times. If the circuit were allowed to be armed, while the first true comma is present, it would miss the true comma and would then synchronize on the first comma to appear afterwards, which is in this case a false comma. If the circuit is armed before the first comma is present, the second, false comma is ignored, because the circuit is disabled promptly when the first comma has been recognized.

If synchronization is required, the SYNC2BYTE circuitry of FIG. 12 must be explicitly enabled as follows: In a first step, the –ENBYSNC control line near the upper left corner is held at the up level For a minimum of 5 bit times. This will reset a set/reset latch 708 near the top center at time CD1 or CD6, and causes the output +A to go down. The –ENBYSNC line must then be lowered to the down level for a minimum of 20 bit times. The gate 710 at the upper left corner will then apply a down level to the data input of latch 700. The down level is transferred to the output +B at time DC3 or CD8. When the line +B is at the down level, the line +COMEN will go up and enable the COMMAC circuitry. The line +B at the down level will generate a down level for the life +E, unless there is currently a comma present in the register DES5QREG (FIG. 10) as indicated by +COMX (FIG. 11). The level of the line +E is stored in still another latch 702 at time CD1 or CD6. If the input line –ENBYSNC is held at the down level for less than 20 bit times, a synchronization request might be ignored, if the true K28.7 comma sits in DES5QRG with a trailing false comma at the time the request is made.

Once the outputs of both latches 702 and 708 at the top center are at the down level, the line +D will be at the up level, the set/reset latch 704 at the right side will be set two bit times later, and another 3 bit times later the lower middle latch 708 will be set, and the line +A goes to the up level which prevents the latch 704 at the right from being set again without first bringing the –ENBYSNC line to the up level and then down again; also, in a timed sequence, the lines +B and +C will go up.

The circuitry is monitoring the arrival of a comma for as long as the signal line +ENSYNC is at the up level; while the search for a comma is active, data at the output of DES5Q20Q (FIG. 14) continues to be presented with the old alignment, except that the byte preceding the comma may be corrupted, if there is any change in synchronization. The +ENSYNC line goes down 2 bit periods after the first comma in DES5QREG (FIG. 10). has been recognized.

The gates 712 and 714 around the center left side of the diagram monitor the +COMX line and determine whether a comma has appeared at time +CD1 or +CD6. The line +COMX (upper left side) comes from the circuit block COMMAC (FIG. 11) and is at the up level whenever the COMMAC circuits see the '0011111' or '1100000' sequence. In the armed state, the two 3-way AND gates 712 and 714 sample +COMX at time CD1 and CD6. If a comma is present, either the line +T1 or +T6 will go up, depending on the time. In either case +CD1X6ENA will set the 2-port latch 'BYTESYNC' 706 at the upper right side. An up level of +BYTESYNC resets 2 bit times later the latch 'ENSYNC' 704 at the upper right side, and any further monitoring for commas is stopped. An up level in –ENSYNC causes +BYTESYNC (706) to be reset 10 bit times after it has been set. The signal +BYTESYNC is also an external output, to alert the attached adapter that a synchronization event has occurred in response to the –ENBYSNC request, and that the next word will have a comma character properly aligned in the first of the two byte positions at the output of the deserializer.

The +CD1X6ENA signal is also sent to COMMAC (FIG. 11) where it sets one of the five latches COM5 to COM9. At the same time the 2-port latch 716 at the center left side of FIG. 12 will record whether TI or T6 has appeared. The outputs of this latch are guided through a gate each, 718 and 720, which are disabled by the signal –COMXSYNC while the latch 716 is being updated in order to avoid timing hazards during LSSD testing and to suppress any possible transition in the word-clocks +CVA and +CVB at this time. The output +X of the upper gate 718 goes to the up level if the comma has appeared at time CD1; conversely, the output –X of the lower gate 720 goes to the up level if the comma has appeared at time CD6. This latch controls the phase of the clocks operating with one or two byte cycle times.

The two latches 722, 724 in the lower half of the right side of of FIG. 12 and the gate 726 at the lower left corner are used to generate the word-clock +CVB, which has a cycle time of 20 bit times. As mentioned above, any transition of +CVA at synchronization time is suppressed. This is accomplished by inhibiting by the signal COMXSYNC which prevents clock CD6X1B from rising while COMX is asserted. Five bit times later the latch CVA (722) is clocked, possibly with a new selection for CD6X1B, while BYTE-SYNC forces an up level at the data input of the latch. Note that an actual pulse in +CD1X1B is suppressed only, when an actual change in the CD1X1B clock occurs (CD1 or (CD6). Two bit times later the value of this first latch 722 is transferred to a second latch CVB (724), and another eight bit times later the complement value of +CVA is fed back to the first latch 722, which will thus be complemented every 10 bit times. During resynchronization the byteclock +CVB may be affected in 4 different ways, none of which causes a glitch, i.e. an interval shorter than nominal:
1. No change
2. A down level interval is extended by 5 bit times
3. An up level interval is extended by 10 bit times
4. An up level interval is extended by 15 bit times In each of the above four cases the first negative transition in +CVB will occur 17 bit times after the comma has been recognized, as indicated by the signal +CD1X6ENA. The negative transitions in +CVB occur 8 bit times before the data changes for the next byte in the first byte position. The complement of +CVB has the same timing relationship with the bytes in the second byte position.

The clocks C0V6X1A and C0V6X1B provide the timing for the placement of all even numbered bytes into a first set of ten output latches of DES5Q20QC, page DES7; the clocks C1V6X1A and C1V6X1B select all the odd numbered bytes for a second set of ten output latches.

Figure 14:
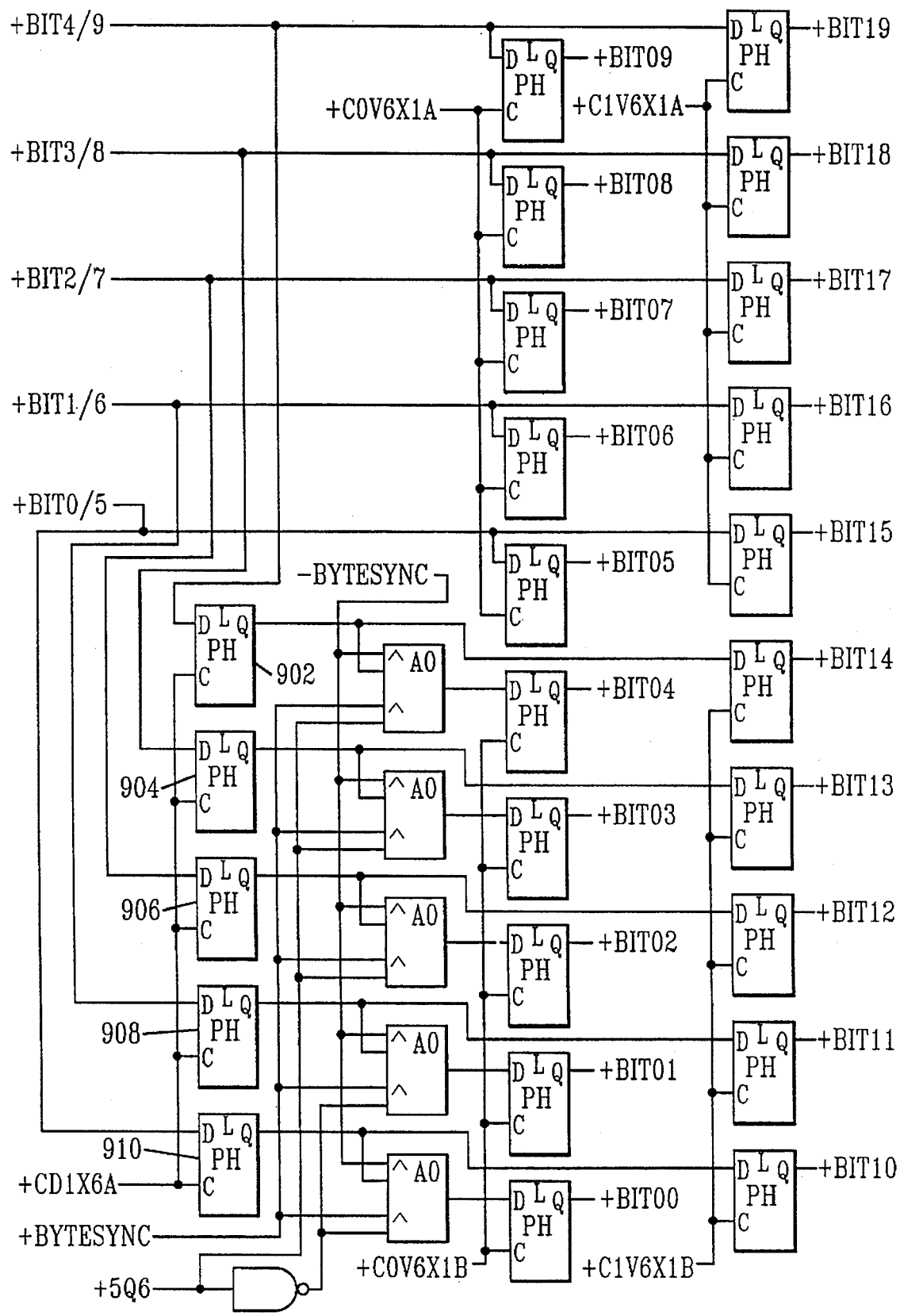
FIG. 14 shows schematically a 5 to 10 bit wide expansion circuit for the deserializer of FIG. 7.2.

The clocks C0V6X1A and C0V6X1B provide the timing for the placement of all even numbered bytes into a first set often output latches of DES5Q20QC of FIG. 14: the clocks C1V6X1A and C1V6X1B select all the odd numbered bytes for a second set often output latches.

Figure 16:
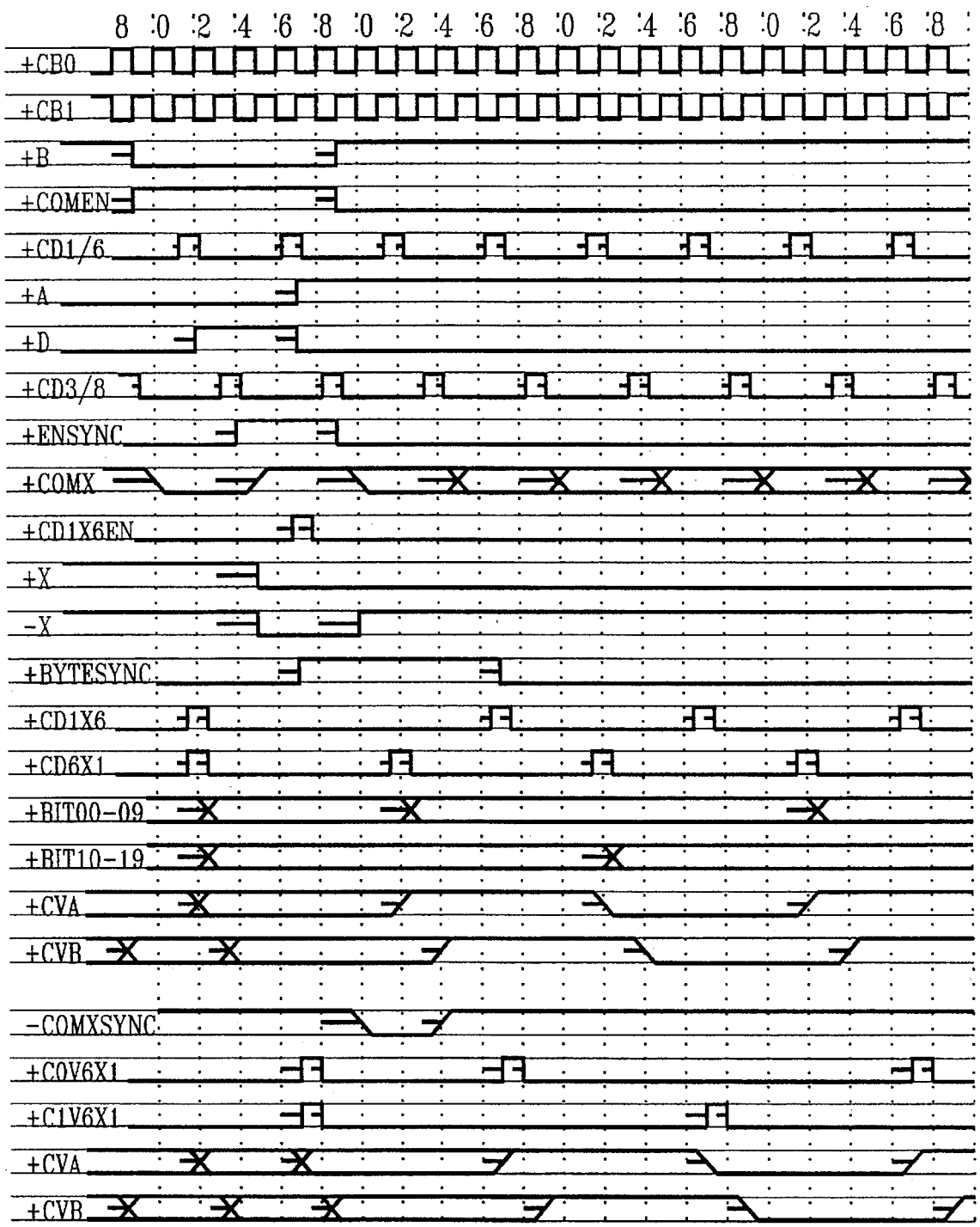

For a detailed illustration of the timing relationships of SYNC2BYTE signals refer to the timing diagrams of FIGS. 15 and 16. The numbers across the top refer to the bit numbers of a byte. The upper portion of DESTIME1 (FIG. 15) shows a resynchronization when +COMX is detected at time CD1, the section below the double line shows the same thing For time CD6. On diagram DESTIME2 (FIG. 16) the upper portion shows synchronization at time CD6, and below the double line at time CD1. The lower part of DESTIME2 shows the timing of the output interface. Note that although the signals +CVA and +CVB show on the left side possible transitions at locations only 5 bit times apart, actual transitions are always at least 10 bit times apart, because the respective latches are clocked at intervals of 10 bit times. During resynchronization clock pulse to the latches CVA and CVB may be suppressed.

Figure 13:
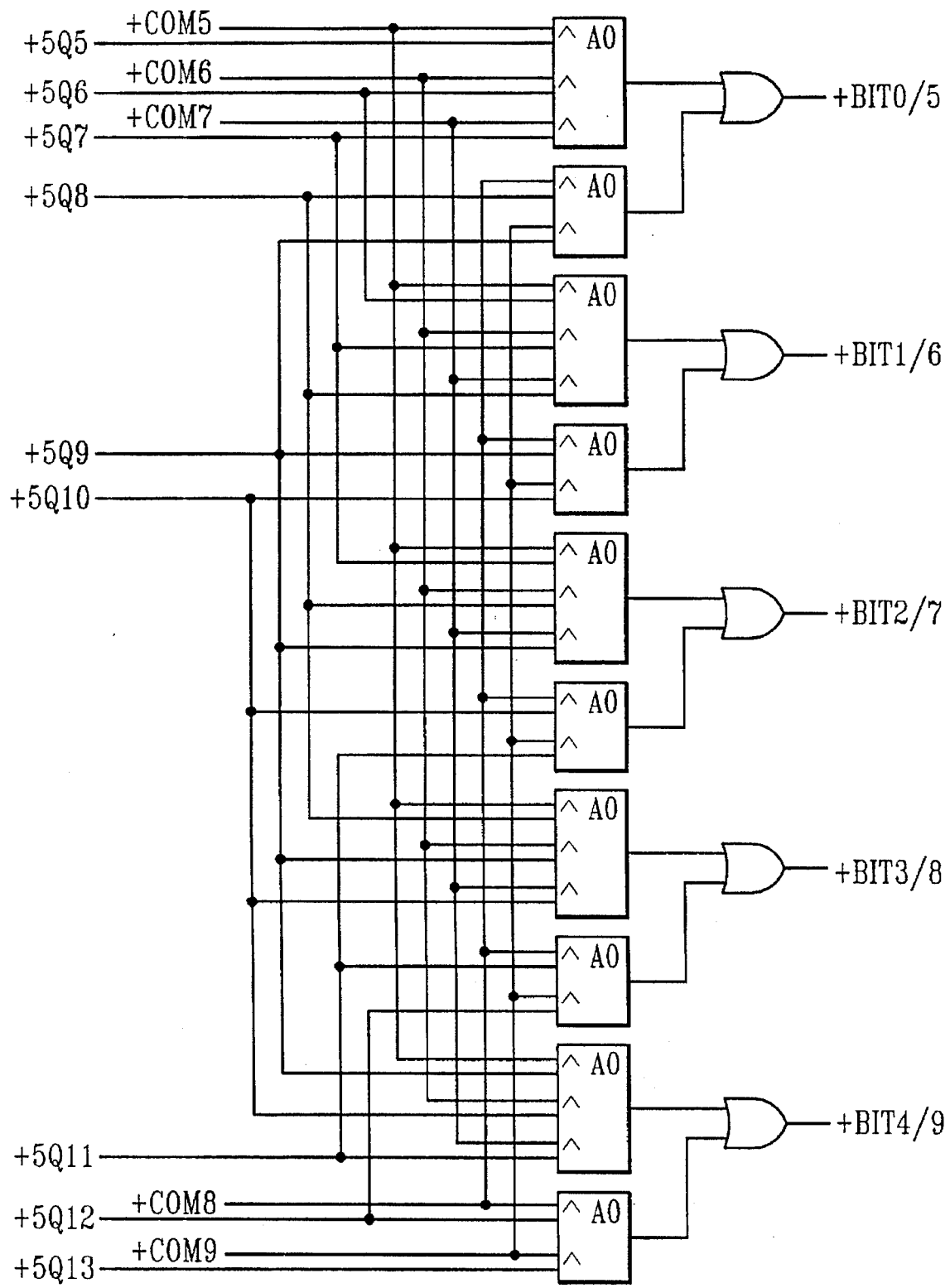
FIG. 13 shows a circuit diagram of the output multiplexer of the deserializer of FIG. 7.2.

Output Multiplexer, SELCTOUT, FIG. 13

This circuitry aligns 5 bit groups to proper byte boundaries. The data is read out from DES5QREG (FIG. 10) under control of the 5 comma latches COM5 to COM9 of FIG. 11. If +COM5 is up, the bits are read from register cells 5Q5 to 5Q9. If +COM6 is up, the bits are read from register cells 5Q6 to 5Q10, and so on. This circuit accomplishes that part of necessary word alignments which is not modulo five bit times by changing the read-out location from DES5QRFG. Adjustments by modulo five are made by the circuit complex SYNC2BYTE, by changes in read-out timing as described above.

Five Bit to Twenty Bit wide Expansion, EES5Q20QC, FIG. 14

DES5Q20QC expands the 5 bit wide byte aligned data format to two 10 bit wide streams operating on alternate cycles. It also includes circuitry to present the comma character upon word synchronization correctly without adding latency.

The left column of five latches (902, 904, 906, 908 and 910) is fed with the first five bits of a byte for temporary storage. The last five bits of a byte are transferred directly into the upper 5 latches of the output registers at the right side, at the same time as the first five bits are transferred from the intermediate buffer into the lower 5 latches. The different clocks for the first and second half of the output bytes are required to satisfy, LSSD clock rules, the actual timing of an entire byte is identical. The timing of the 2 bytes is alternating and 10 bit periods apart.

For the circuitry as shown, ten bits at a time will switch simultaneously; if the interface is an external chip or module boundary, this may be undesirable from a transient noise point of view. The various bits can be made to switch at individual times by various known techniques without adding extra latches. Since all data is read from latches which are updated on 5 bit time cycles, it is possible to skew the clocks by a considerable amount, by selecting clocks 1 or 2 bit times earlier or up to 1 bit time later and skewing them by circuit delays in between, as well as by adding circuit delay at the output. For example, the 5 latches at the left of DES5Q20QC which temporarily hold the first 5 bits of each byte, could be loaded 1 or 2 bit times earlier, and then the first 5 bits of each byte at the output could be loaded up to 4 bit times earlier.

Whenever a new word alignment is set, a copy of the comma character itself, which is used to establish the word boundary, must be presented uncorrupted with correct word alignment. Without the special circuit arrangement described below, this would entail another 10 latches in DES5QREG and an extra delay of 5 bit times, because detecting the comma, resetting the multiplexer SELCTOUT, and reading out the first five bits within a single 5 bit time cycle would violate our ground-rules for timing margins. Instead, when a comma is being recognized and might change the control of the SELECTOUT gates of FIG. 13, we force the first five bits in the output to 00111 or 11000, depending on the value of +5Q6 in DES5QREG at the time of loading into the output register cells BIT00 to BIT04. The bit residing in 5Q6 of FIG. 10 at theft time was in Q11 at the time the comma was detected by the circuit COMMAC of FIG. 11.1. Depending on the byte alignment of the incoming data in DES5QREG, +5Q11 may represent any bit in the comma sequence from the third to the last. If +Q11 is a one and COMMAC sees a comma, we know that it is '0011111', if +Q11 is a zero, the comma is '1100000'. If the word synchronization circuitry SYNC2BYTE of FIG. 12 is armed, i.e. 'ENSYNC' is asserted, the actual presence of either version of the comma is signaled by the assertion of the 'BYTESYNC' lines.

If only one polarity of the comma is sensed, e.g 0011111 by circuit COMMA of FIG. 11.2, the first 5 bits are forced to 00111 and it is not necessary to monitor the bit cell 5Q11.

The signals ±BYTESYNC and +5Q6 control the five gates in the center of DES5Q20QC, which set the first five bits to the correct pattern without pending on the normal data transfer path upon resynchronization. For single polarity comma detection, these gates can be reduced to 2 AND and 3 OR gates.

Note that the forcing of bits in the output is possible only, if the identical bit pattern has been detected by the COMMAC circuitry; therefore, despite appearances to the contrary, the procedure will never change what has been received at the input. The preset circuitry is not activated during the waiting time for a comma, which allows the presentation of data at the output with the existing alignment, while searching for a comma. This capability would be a requirement for continuous enabled word alignment (hot sync) operation.

Disregarding circuit delays, the first synchronized character, which is the comma character, is ready at the output interface 12 bit times before the signal +CVB falls for the first time after the +BYTESYNC line has gone up; the line +BYTESYNC stays up for 10 bit times and falls 7 bit times before the first falling +CVB transition. The second and all subsequent odd numbered bytes are ready 12 bit times before +CVB rises.

Timing Charts, DESTIME1, DESTIME2, FIGS 15 and 16

DESTIME1 (FIG. 15) shows in the top half the transfer of data into SERREG and DES5QREG. The bottom half shows two cases of byte synchronization, and data transfer into the output registers. In the first case +COMX is up during time CD1; in the second case +COMX is up during time CD6.

DESTIME2 (FIG. 16) shows the entire synchronization process from the time it is activated until the first byte is ready in the output register, again for 2 cases of the comma arrival time relative to the decade counter. The chart assumes that a comma (+COMX) appears at the earliest opportunity. In a typical case the line +ENSYNC will be at the up level writing for a comma for a longer time.

Parity Generator, DESPAR, FIG. 17

DESPAR, an optional circuit, generates a parity bit for every byte, based on the data as seen near the deserializer input.

An odd parity bit for each byte is generated from the receiver data near the front end of the serial 2 wide register SERREG (FIG. 8). It is understood that an odd parity exists if the ten bits of a byte plus the parity bit together contain an odd number of ones. The intended purpose of the parity is to support on-line diagnostic methods in the case of solid or intermittent errors. Because of the placement of the generator early in the data stream, most possible error sources in both the data path and deserializer clock are covered.

The basic method to generate the parity is as follows: a new running parity P0 is generated from 2 consecutive bits together with the previous value of the running parity. If the running parity at the end of a byte is different from the value at the start of a byte, the number of bits in the byte with a value of one is odd and the parity bit is set to zero; otherwise it is set to one. This approach obviates the need for any reset or initialization circuits, which are cumbersome at high speeds.

The implementation of this simple concept in the deserializer is complex, because the last bit of a byte may show up in one or the other of the two parallel half-rate bit streams of SERREG, and the timing relative to the deserializer clock DESCLK 10 varies depending on the setting of the COMMAC and SYNC2BYTE circuits. However, from the setting of +X in SYNC2BYTE and +COM5, +COM6, +COM7, +COM8, and +COM9 in COMMAC, both the location and time of the first and last bit of a byte in SERREG can be determined unambiguously. The parity for the first and second byte after synchronization should be ignored, since they may be incorrect.

To understand the circuit, one must be familiar with the bit labelling scheme used in the data path. The 2 wide register SERREG has the following form:

$$DX \rightarrow 2Q9 \rightarrow 2Q7 \rightarrow 2Q5 \rightarrow 2Q3 \rightarrow 2Q1$$

$$DY \rightarrow 2Q8 \rightarrow 2Q6 \rightarrow 2Q4 \rightarrow 2Q2 \rightarrow 2Q0$$

2Q9 and 2Q8 on the left side are fed alternately with a new bit from the retiming circuitry. At a particular time, the first bit of a byte may be located in latch 2Q0, the second and following bits of the byte in latch 2Q3, 2Q4, 2Q7, and 2Q8, all clocked by +CB1, which is up at time 1, 3, 5, 7, and 9. Alternatively, for other settings of the COMMAC and SYNC2BYTE latches, the first bit of byte may appear at a particular time in latch 2Q1, the second and following bits in latch 2Q2, 2Q5, 2Q6, and 2Q9, all clocked by +CB0, which is up at time 0, 2, 4, 6, and 8.

Parity Implementation

To generate the parity, in a first step the output of 2Q8 is run together with the running parity P0 through a 2-way exclusive OR gate 170 at the top left side to generate the intermediate result P1. In a second step one bit time later P1 is run through a second 2-way exclusive OR gate 171 together with either 2Q5 or 2Q9, depending on the control inputs of an AND-OR gate 172, to generate a new running disparity P0. If it is determined from the setting of the synchronization circuits that the first bit and all even numbered bits (0 through 9) of a byte pass through 2Q8 and 2Q6, the control inputs of the AND-OR gate 172 must select the odd numbered bits of a byte from 2Q9. Alternatively, if the odd bits pass through 2Q8 and 2Q6, the even bits are collected from 2Q5, by applying the complementary control levels to the AND-OR gate 172. Note that this scheme avoids any manipulation of the high speed clocks +CB0 and +CB1 to the two latches at the top left side of the circuit diagram.

At the end of each byte the running parity P0 is recorded in a latch 173 as P3 for use at the end of the next byte, where it is compared with the then current running parity P0 in another 2-way exclusive OR gate 174. If the running parity over a byte has changed, there is an odd number of bits in the byte and the byte parity PB must be set to zero, otherwise to one. Another latch PAR 175 is required to align the parity bit in time with the data bits at the output.

Control of Selection of 2Q5 or 2Q9, and Timing of Parity Generator

The signal +X in SYNC2BYTE (FIG. 12) is at the up level if the comma used to establish byte synchronization was detected by the clock +CD1; the line +X is at the down level if the comma was detected by the clock +CD6. The first condition will be referred to below by simply X, the second by X.

The 5 wide register DES5QREG (FIG. 10) has the following form:

$$2Q1/0 \rightarrow 5Q11 \rightarrow 5Q6 \quad .$$
$$2Q2/3 \rightarrow 5Q12 \rightarrow 5Q7 \quad .$$
$$2Q5/4 \rightarrow 5Q13 \rightarrow 5Q8 \quad .$$
$$2Q6/7 \rightarrow 5Q14 \rightarrow 5Q9 \quad .$$
$$2Q9/8 \rightarrow 5Q15 \rightarrow 5Q10 \rightarrow 5Q5$$

The left column 2Qx/y represents the data source SERREG. For a read out time of CD3 the value x is valid, for a read out time of CD8 the value y applies. All 5Qz outputs are updated at time CD3 and CD8 by +CD3/8. In the 5Qz register serially consecutive bits are located in consecutively numbered latches. As explained under COMMAC, for a particular timing relationship between the serial link data and the receiver decade counter, the first bit of a byte may pass through latch 5Q5, 5Q6, 5Q7, 5Q8, or 5Q9; for COM5 or COM6 the first bit of a byte shows up in 5Q5 or 5Q6 respectively; this places the last bit of a byte at the same instant into 5Q14 or 5Q15 respectively. For COM7, COM8, or COM9 the first bit of a byte is found in 5Q7, 5Q8, or 5Q9 respectively, and the last bit of a byte is located 5 serial bit times later in 5Q11, 5Q12, or 5Q13 respectively. These conditions will be referred to below as simply COM5, COM6. etc. The symbol "●" represents the logical AND Function. Below we will determine the location and time of the last bit of a byte for each of the ten different synchronization settings. Each latch 2Qx of SERREG maintains a bit value For the duration of 2 serial bit times; the read-out times listed below refer to the second half of this data interval (ignoring the latch delay), In DES5QREG, the bits 5Qx are valid for 5 bit intervals and are usually read out during the fourth bit interval. i.e. a comma detected at time CD1 was written into the register at time CD8, and a comma read at time CD6 was written at time CD3.

The AND-OR gate 172 near the upper left side must select +2Q9 for all cases where the last bit (No. 9) and all other odd numbered bits of a byte passes through 2Q9, otherwise it must select +2Q5.

The timing of the parity bit is similar to the timing of the last bit of a byte and must be synchronous with the byte at the output.

If the last bit of byte and all other odd numbered bits era byte pass through 2Q9, the running parity P2 and the parity PB at the end era byte must be updated by PCLK one bit time later than the bit is read out from 2Q9.

If the last bit and all other odd numbered bits of a byte pass through 2Q8, the running parity P2 and PB at the end of a byte must be updated by PCLK two bit times later than the bit is read out from 2Q8.

Most deserializer functions repeat on 2, 5, or 10 bit cycles and the clock nomenclature is based on a 10 bit cycle, as is the parity generator. In order to better keep track of the timing of the parity bit of a particular byte across multiple byte cycles, we extend the timing scale beyond ten from 00 to 19 and add in the text below the modified number in parenthesis. This enables us to distinguish between successive bytes.

The ten different synchronization states can be characterized as follows:

1. COM5 ●X

The last bit era byte is read into 5Q14 at clock time CD8 (08) from 2Q7, it can be read from 2Q9 at time CD7 (07); it is transferred to 5Q9 at time CD3 (13), and from there to the output latch of FIG. 14 at time CD6 (16). G=1, PCLK=+CD8 (08).

2. COM5 ●X'

The last bit era byte is read into 5Q14 at clock time CD3 (03) from 2Q6, it can be read from 2Q8 at time CD2

(02); it is transferred to 5Q9 at time CD8 (08), and from there to the output latch at time CLD1 (11). G=0, PCLK=+CD4 (04).

3. COM6 ●X

The last bit era byte is read into 5Q15 at clock time CD8 (08) from 2Q8; it is transferred to 5Q10 at time CD3 (13), and from there to the output latch at time CD6 (16). G=0, PCLK=+CD0 (10).

4. COM6 ●X'

The last bit era byte is read into 5Q15 at clock time CD3 (03) from 2Q9; it is transferred to 5Q10 at time CD8 (08), and from there to the output latch at time CD1 (11). G=1, PCLK=+CD4 (04).

5. COM7 ●X

The last bit of a byte is read into 5Q11 at clock time CD3 (13) from 2Q1; it can be read from 2Q9 at time CD9 (09); it is transferred to the output latch at time CD6 (16). G=1, PCLK=+CD0 (10).

6. COM7 ●X'

The last bit of a byte is read into 5Q11 at clock time CD8 (08) from 2Q0, it can be read from 2Q8 at time CD4 (04); it is transferred to the output latch at time CD1 (11). G=0, PCLK=+CD6 (06).

7. COM8 ●X

The last bit of a byte is read into 5Q12 at clock time CD3 (13) from 2Q2; it can be read from 2Q8 at time CD0 (10); it is transferred to the output latch at time CD6 (16). G=0, PCLK=+CD2 (12).

8. COM8 ●X'

The last bit of a byte is read into 5Q12 at clock time CD8 (08) from 2Q3, it can be read from 2Q9 at time CD5 (05); it is transferred to the output latch at time CD1 (11). G=1, PCLK=+CD6 (06).

9. COM9 ●X

The last bit of a byte is read into 5Q13 at dock time CD3 (13) from 2Q5, it can be read from 2Q9 at time CD1 (11); it is transferred to the output latch at time CD6 (16). G=1, PCLK=+CD2 (12).

10. COM9 ●X'

The last bit of a byte is read into 5Q13 at clock time CD8 (08) from 2Q4, it can be read from 2Q8 at tune CD6 (06); it is transferred to the output latch at time CD1 (11). G=0, PCLK=+CD8 (08).

The results can be tabulated as follows:

|  | COM5 | | COM6 | | COM7 | | COM8 | | COM9 | |
|---|---|---|---|---|---|---|---|---|---|---|
|  | X | X' | X | X' | X | X' | X | X' | X | X' |
| SEL2Q9 | 1 | 0 | 0 | 1 | 1 | 0 | 0 | 1 | 1 | 0 |
| PCLK | 8 | 4 | 0 | 4 | 0 | 6 | 2 | 6 | 2 | 8 |
| (PCLK) | 08 | 04 | 10 | 04 | 10 | 06 | 12 | 06 | 12 | 08 |
| (PAR) | 16 | 11 | 16 | 11 | 16 | 11 | 16 | 11 | 16 | 11 |

SEL2Q9=1 means that the AND-OR 172 selects the +2Q9 input.

Once the synchronization process is completed the state of the parity control logic does not change and the power consumption is negligible, if implemented in CMOS.

The circuit shown in FIG. 17 will generate a parity for each byte; for the 2 byte interface deserializer shown above, a parity bit for every 2 bytes might be more appropriate, in which case it is just a matter of changing the timing for the 3 latches P3 (173), PB (176), and PAR (175).

Extension of Useful Life of CMOS SERDES Circuits

CMOS circuits operating at high clock rates and driving heavy loads can degrade at an excessive rate due to hot electron effects. The design of this invention has an inherent advantage because the highest required clock rates are only one half of the bit rate. The half-rate clock circuits are only moderately loaded because the number of high speed circuits has been minimized. A further significant improvement can be achieved by a replacement of the two half rate clocks CB0 and CB1 by four quarter rate clocks CQ0, CQ1, CQ2, and CQ3, each active for one of four bit periods, and by a substitution of two-port latches for all latches which formerly were driven by half rate clocks. The two data inputs of the latches are tied together and a pair of non-adjacent quarter rate clocks CQ0 and CQ2, or CQ1 and CQ3, drive the dock inputs.

Figure 18:
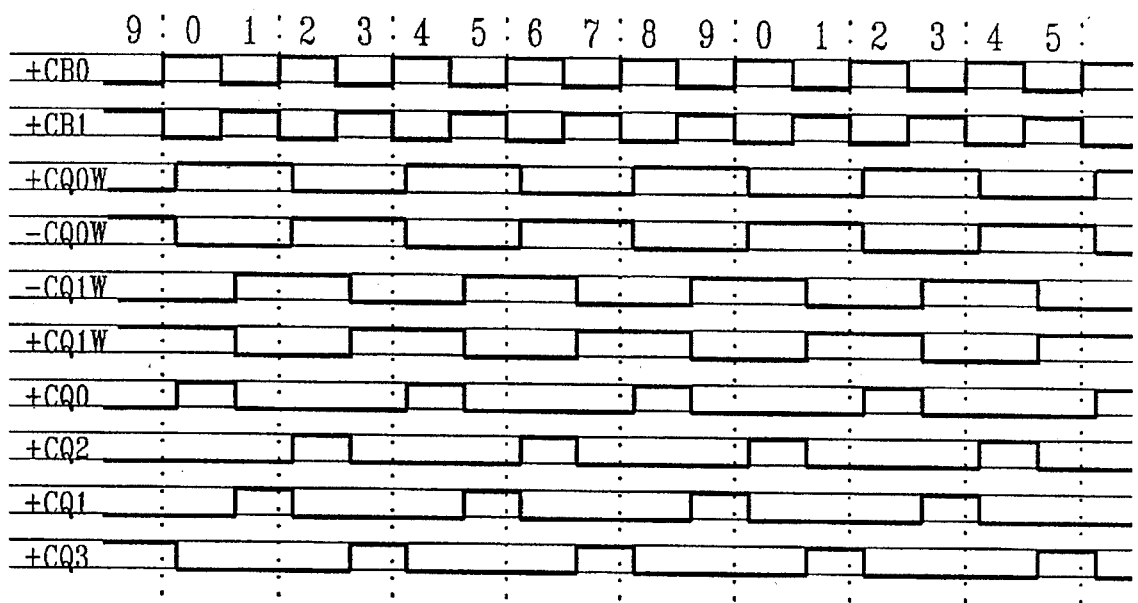
FIG. 18 shows a timing diagram of a set of quarter-rate clocks used for another embodiment of a deserializer according to the present invention.

The quarter rate clocks are derived by well known techniques by the clock recovery circuits that preferably use current switch logic technology for which degradation is less severe because of the lower voltages across the devices, or alternatively, a faster technology not afflicted by this reliability problem may be used for the clock recovery circuits. A set of quarter rate clocks and their derivation from half-rate clocks is illustrated in FIG. 18. The two half-rate waveforms CB0 and CB1 are first reduced to symmetrical quarter rate waveforms CQ0W and CQ1W by 2 flip-flops. Four gates using these quarter rate waveforms select alternate pulses from the half-rate waveforms and generate 2 pairs of non-overlapping quarter rate clocks CQ0/CQ2 and CQ1/CQ3. Note that the logical OR function on the quarter-rate clocks CQ0 and CQ2 would regenerate a half-rate clock which resembles CB0, if delays are ignored; CQ1 and CQ3 take the place of CB1.

Figure 19:
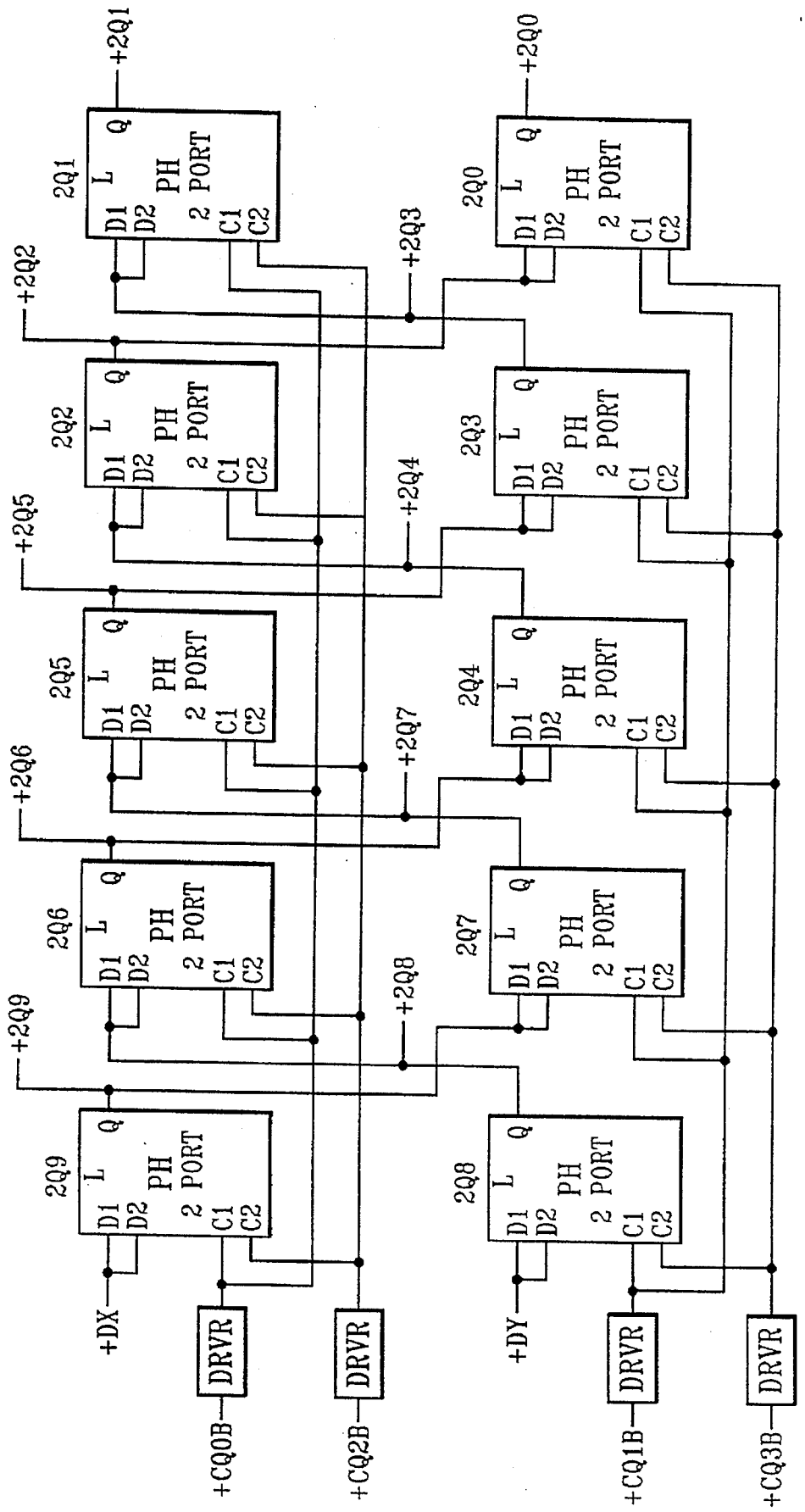
FIG. 19 shows the the serial register of FIG. 8 modified for operation with quarter-rate clocks.

The serial 2 bit wide register SERREG of FIG. 8 modified for operation with quarter-rate clocks is shown in FIG. 19. Note that the latches have been rearranged into rows with common clocks and the AND-OR gates have been removed. As explained previously the last letter B in the clock names has no functional significance other than compliance with LSSD rules.

Figure 20:
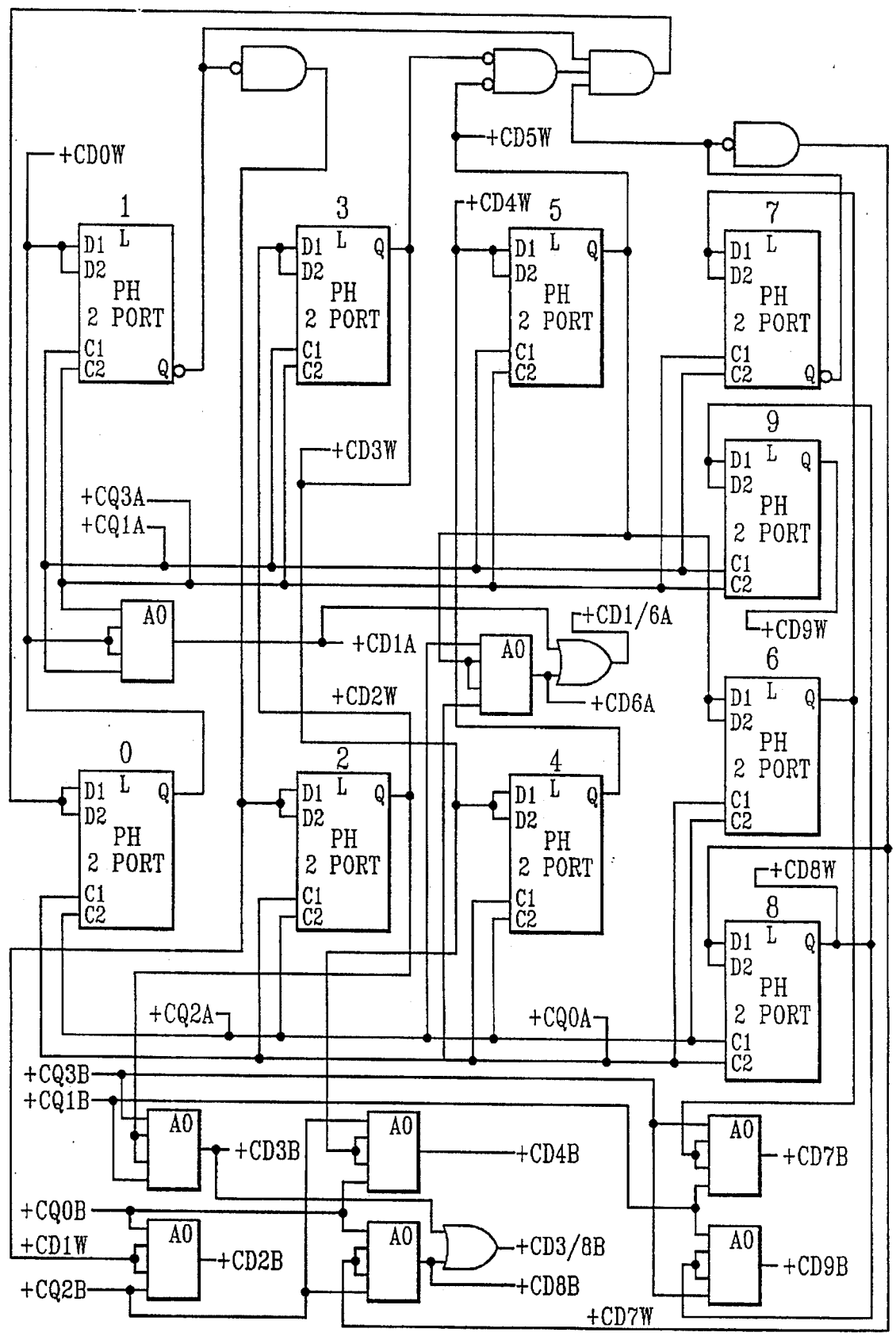
FIG. 20 shows a decade counter with associated clocks using quarter-rate clocks as a substitution for FIG. 9.

FIG. 20 represents the quarter rate version of the decade counter, substituted for FIG. 9. There are some delay penalties. The 2-port latches tend to be slower and this design assumes that only one or the other polarity is available at the output, but not both. Also for the derived clocks such as CD2B and CD3/8B there is more delay, because the fan-in of the gates is doubled.

Figure 21:
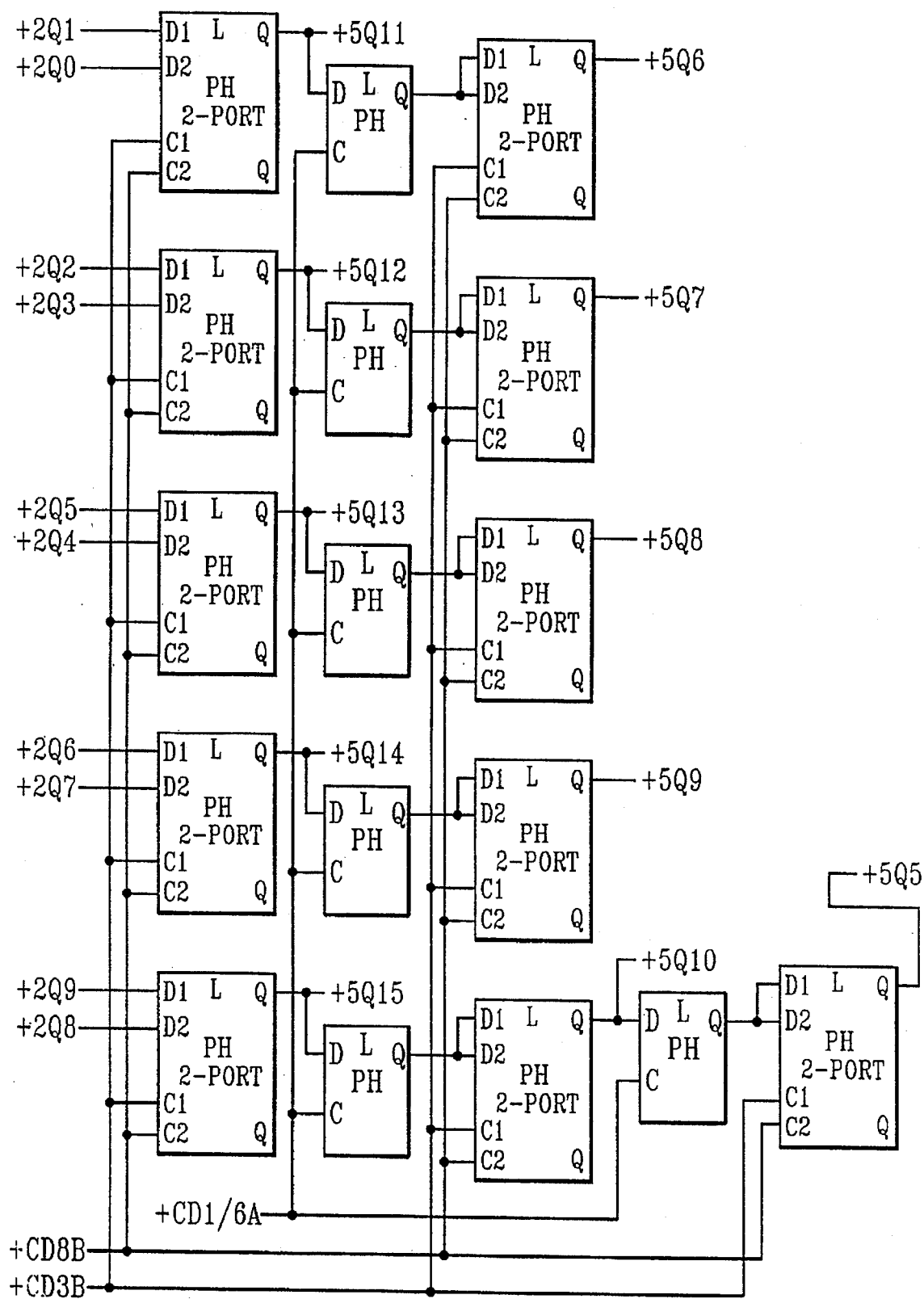
FIG. 21 shows a 5 bit wide register using 2-port latches to replace FIG. 10.

FIG. 21 representing the 5-wide register using 2-port latches. The 2-port feature of latches in the first row on the left side performs the AND-OR function of the gates at the top of FIG. 9 with better timing precision. The other 6 slave latches are also converted to 2-port latches to make the timing of all 11 slave latches uniform and to simplify the clock requirements.

Merits of the Invention

The deserializer traditionally has required high performance circuits even at midrange data rates. The design presented above can help to meet the market demand for lower cost, higher integration levels, and arrays of data links, because for a given technology it can operate at high data rates with solid design margins. Several hundred Mbit/s can be handled by implementations using standard cells of CMOS technologies in current production. The circuits provide the margins and testability required for inclusion on large chips. For all but the highest rates, a design verification based on logic simulators rather than extensive circuit simulations should be adequate. The design makes more efficient chip partitioning possible and can eliminate chip interfaces which are generally power intensive and a reliability exposure.

The power advantage over competing designs is particularly significant and provable in the case of CMOS technology, where the circuit switching rate and the power levels of the individual logic books determine the bulk of the power consumption. Although the number of circuits used in the above design may be higher, the number of gates switched per byte received is typically less than half by a comfortable margin. It is also incontestable, that the required power level of the gates will be substantially lower.

The low power consumption, combined with normal testability and solid design margins makes the deserializer, according to the present invention, a good candidate for implementations requiring arrays of deserializers on a single chip.

This deserializer, according to the present invention, does not require any manipulation of the clocks at the bit or half-bit rate or in the decade counter DESCLK10 (FIG. 9), which controls the timing of the entire deserializer. This feature reduces the performance requirements for the circuits used, and the basic clock is in control of the sequence of events at all times, even during byte and word synchronization, which makes it easier to avoid glitches and test problems. Glitches in the clock would complicate the design of the attached adapter, especially its diagnostic circuits.

The deserializer, according to the present invention, has functional advantages. It does not generate clock glitches upon synchronization, neither in, the one nor the two byte interface version. The deserializer, according to the present invention, avoids false synchronization across the trailing edge of the K28.7 comma character of U.S. Pat. No. 4,486,739 by simple means, regardless of when the −ENBYSNC line is asserted.

What is claimed is:

1. A structure comprising:
    a bit stream having a bit rate;
    a first clock at half said bit rate;
    a second clock at half said bit rate;
    said first clock selects a first group of N bits from said bit stream;
    said second clock selects a second group of N bits from said bit stream;
    said first clock is out of phase with respect to said second clock so that the first group of N bits and said second group of N bits are alternately selected from said bit stream;
    first means for storing said first group of N bits and said second group of N bits comprising 2N storage cells, a first set of N cells of said 2N storage cells are clocked by said first clock, a second group N cells of said 2N storage cells are docked by said second clock;
    means clocked by said first clock for placing said first group of N bits into said first means for storing N bits of said bit stream by initially placing the first bit of said first group of N bits into one cell of said first group of N cells;
    means for sequentially transferring each of said first group of N bits from said one cell of said first group of N cells to a cell from said second group of N cells and sequentially therefrom to another cell of said first group of N cells, such sequential transfer from a cell of said first group of N cells to a cell from said second group of N cells being repeated until said first group of N bits are stored in said first storage location in said first group of N cells;
    means clocked by said second clock for placing said second group of N bits into said first means for storing N bits of said bit stream by initially placing the first bit of said second group of N bits into one cell of said second group of N cells;
    means for sequentially transferring each of said second group of N bits from said one cell of said second group of N cells to a cell from said first group of N cells and sequentially therefrom to another cell of said second group of N cells, such sequential transfer from a cell of said second group of N cells to a cell from said first group of cells being repeated until said second group of N bits are stored in said first storage location in said second group of N cells;
    means for transferring said first group of N bits in unison from said first means for storing into a second means for storing clocked by a third clock;
    said third clock is substantially congruent with said second clock except that after each phase of said third clock there is missing N-1 pulses of said second clock;
    means for transferring said second group of N bits in unison from said first means for storing into said second means for storing clocked by a fourth clock;
    said second group of N bits being transferred from said first means for storing to said second means for storing N bits of said bit stream after said first group of N bits are transferred from said first means for storing to said second means for storing;
    said fourth clock is substantially identical to said third clock but delayed with respect to said third clock by N bit intervals and its pulses are substantially congruent with said first clock;
    means for transferring said first group of N bits from said second means for storing substantially in unison to a third means for storing having N cells;
    means for transferring, substantially in unison, said first group of N bits from said third means for storing to a first group of N cells of a fourth means for storing having 2N cells;
    means for transferring said second group of N bits, substantially in unison, from said second means for storing to a second group of N cells of said fourth means for storing;
    means for maintaining said first group of N bits in said third for means for storing for more than N bit intervals of said bit stream so that said transfer of said first group of N bits to said fourth means for storage is substantially in unison with said transfer of said second group of N bits from said second means for storing to said fourth storage means.

2. A structure according to claim 1 wherein N=5.

3. A structure according to claim 1 further including means for determining boundaries selected from the group consisting of byte boundaries and word boundaries in said second means for storing said first group of N bits and said second group of N bits.

4. A structure according to claim 3 wherein said boundary is a comma.

5. A structure according to claim 3 wherein said means for determining boundaries has means for searching for a sequence of bits stored in said second means for storing.

6. A structure according to claim 1 wherein said means for transferring said first group of N bits and said means for transferring said second group of N bits is a group of N gated AND-OR circuits electrically interconnecting said first means for storing and data inputs of said second means for storing.

7. A structure according to claim 1 further including means for ORing said third clock and said fourth clock to generate a pulse every N bit intervals.

8. A structure according to claim 1 wherein said third shift register is formed from a plurality of single port latches.

9. A structure according to claim 1 wherein said third shift register is formed from a plurality of 2-port latches, each having a separate data and clock input.

10. A structure according to claim 1 wherein said second means for storing further comprises a first and second N bit register and an additional bit storage location so that 2N+1 consecutive bits of said bit stream can be stored in said second means for storing.

11. A structure according to claim 10 further including means for locating within said 2N+1 consecutive bits a specific sequence of C bits wherein C<2N+1.

12. A structure according to claim 11 wherein N=5 and C=7.

13. A structure according to claim 12 wherein said means for transferring said first group of N bits and said means for transferring said second group of N bits is a group of N gated AND-OR circuits electrically interconnecting said first means for storing and data inputs of said second means for storing.

* * * * *